(12) United States Patent
Miyazaki

(10) Patent No.: US 6,356,065 B1
(45) Date of Patent: Mar. 12, 2002

(54) CURRENT-VOLTAGE CONVERTER WITH CHANGEABLE THRESHOLD BASED ON PEAK INPUTTED CURRENT

(75) Inventor: Keizo Miyazaki, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/651,798

(22) Filed: Aug. 30, 2000

Related U.S. Application Data

(63) Continuation-in-part of application No. 09/649,603, filed on Aug. 29, 2000.

(30) Foreign Application Priority Data

Aug. 30, 1999 (JP) .............................................. 11-243204
Aug. 24, 2000 (JP) ........................................ 2000-254013

(51) Int. Cl.[7] .................................................. G05F 3/16
(52) U.S. Cl. ...................................... 323/315; 323/313
(58) Field of Search ................................. 323/313, 314, 323/315, 316; 363/73

(56) References Cited

U.S. PATENT DOCUMENTS

| | | | | | |
|---|---|---|---|---|---|
| 4,086,624 A | * | 4/1978 | Fraley | ......................... | 363/127 |
| 4,642,551 A | * | 2/1987 | Miller | ......................... | 323/314 |
| 4,877,953 A | * | 10/1989 | Yamamuro | ................... | 327/103 |
| 5,123,732 A | * | 6/1992 | Gross et al. | ................. | 327/325 |
| 5,237,493 A | * | 8/1993 | Durig et al. | ................... | 363/73 |
| 5,266,887 A | * | 11/1993 | Smith | ......................... | 323/316 |
| 5,563,502 A | * | 10/1996 | Akioka et al. | .............. | 323/313 |
| 5,841,310 A | * | 11/1998 | Kalthoff et al. | ............. | 327/337 |
| 5,952,885 A | * | 9/1999 | Wu et al. | .................... | 330/294 |

* cited by examiner

Primary Examiner—Jeffrey Sterrett
(74) Attorney, Agent, or Firm—Fitzpatrick, Cella, Harper & Scinto

(57) ABSTRACT

There is disclosed a current-voltage converter in which a threshold value during generation of a voltage pulse changes to indicate a constant ratio in accordance with a peak value of an input current with a small circuit scale, and which can select the ratio, and the current-voltage converter for converting a current signal to the voltage pulse comprises: current transmission means for outputting a plurality of currents proportional to an inputted current; current mode peak hold means for inputting the current outputted from the current transmission means, and outputting the current proportional to the peak value of the inputted current; and current comparison means for comparing the current outputted from the current transmission means with the current outputted from the current mode peak hold means, and having a current input and a voltage output for conversion to the voltage pulse.

16 Claims, 24 Drawing Sheets

CURRENT-VOLTAGE CONVERTER WITH CHANGEABLE THRESHOLD BASED ON PEAK INPUTTED CURRENT

CROSS REFERENCE TO RELATED APPLICATIONS

This application is a continuation-in-part of an application Ser. No. 09/649,603 filed on Aug. 29, 2000, entitled "Current-Voltage Converter".

BACKGROUND OF THE INVENTION

1. Field of the Invention

The present invention relates to a current-voltage converter for converting a current signal to a voltage pulse, particularly to a current-voltage converter in which a threshold value during generation of a voltage pulse can change to indicate a constant ratio in accordance with a peak value of an input current.

2. Related Background Art

In a conventional art, when a current signal is converted to a voltage pulse, a main method comprises once converting the current signal to a voltage signal, and subsequently using a desired threshold voltage to convert the voltage signal to the voltage pulse.

For example, when a threshold value during generation of the voltage pulse is changed to indicate a constant ratio in accordance with a peak value of an input current, a circuit shown in FIG. 1 is used. In FIG. 1, R1 denotes a resistance for converting an input signal current $i_{in}$ to a voltage, 41, 42 denote operational amplifiers, the operational amplifiers 41, 42 together with a diode D1 and a capacity C1 disposed therebetween constitute a voltage mode peak hold circuit, and the voltage mode peak hold circuit holds a peak value Vs(peak) of an input signal Vs after the voltage conversion. Characters R2, R3 denote resistances, and form a voltage Vref by dividing Vs(peak) to R3/(R2+R3). A voltage comparator 43 uses Vs as one input and reference voltage Vref as another input. According to FIG. 1, since the reference voltage Vref of the voltage comparator indicates a value obtained by multiplying the input signal peak value by R3(R2+R3), a current-voltage converter can be constituted in which the threshold value during the generation of the voltage pulse changes to indicate the constant ratio in accordance with the peak value of the input current.

However, since the converter shown in the circuit of FIG. 1 is constituted of a plurality of operational amplifiers, voltage comparator, resistance, diode, capacitor, and the like, a circuit scale tends to be enlarged.

As described above, according to a shown technique, in the constitution of the current-voltage converter in which the threshold value during the generation of the voltage pulse changes to indicate the constant ratio in accordance with the peak value of the input current, there is a problem that the circuit scale is enlarged. This raises problems such as increase of occupied area, and increase of power consumption, and there is a room for improvement.

SUMMARY OF THE INVENTION

An object of the present invention is to provide a current-voltage converter which can change a threshold value during generation of a voltage pulse to indicate a constant ratio in accordance with a peak value of an input current with a smaller circuit scale.

Further object of the present invention is to provide a current-voltage converter which can select the ratio.

Another object of the present invention is to provide a current-voltage converter comprising: current transmission means for outputting a plurality of currents proportional to an inputted current; current mode peak hold means for inputting the current outputted from the current transmission means, and outputting the current proportional to a peak value of the inputted current; and current comparison means for comparing the current outputted from the current transmission means with the current outputted from the current mode peak hold means, inputting the current for conversion to a voltage pulse, and outputting a voltage.

Still another object of the present invention is to provide a current-voltage converter comprising: current transmission means for outputting a plurality of currents proportional to an inputted current; current mode peak hold means for inputting the current outputted from the current transmission means, and outputting the current proportional to a peak value of the inputted current; subtraction means for obtaining a difference between the current outputted from the current transmission means and the current outputted from the current mode peak hold means; and current-voltage conversion means for inputting the current outputted from the subtraction means and outputting a pulse voltage depending upon whether the input current is positive or negative.

DETAILED DESCRIPTION OF THE PREFERRED EMBODIMENTS

Embodiments of the present invention will be described in detail with reference to the drawings.

Figure 1:
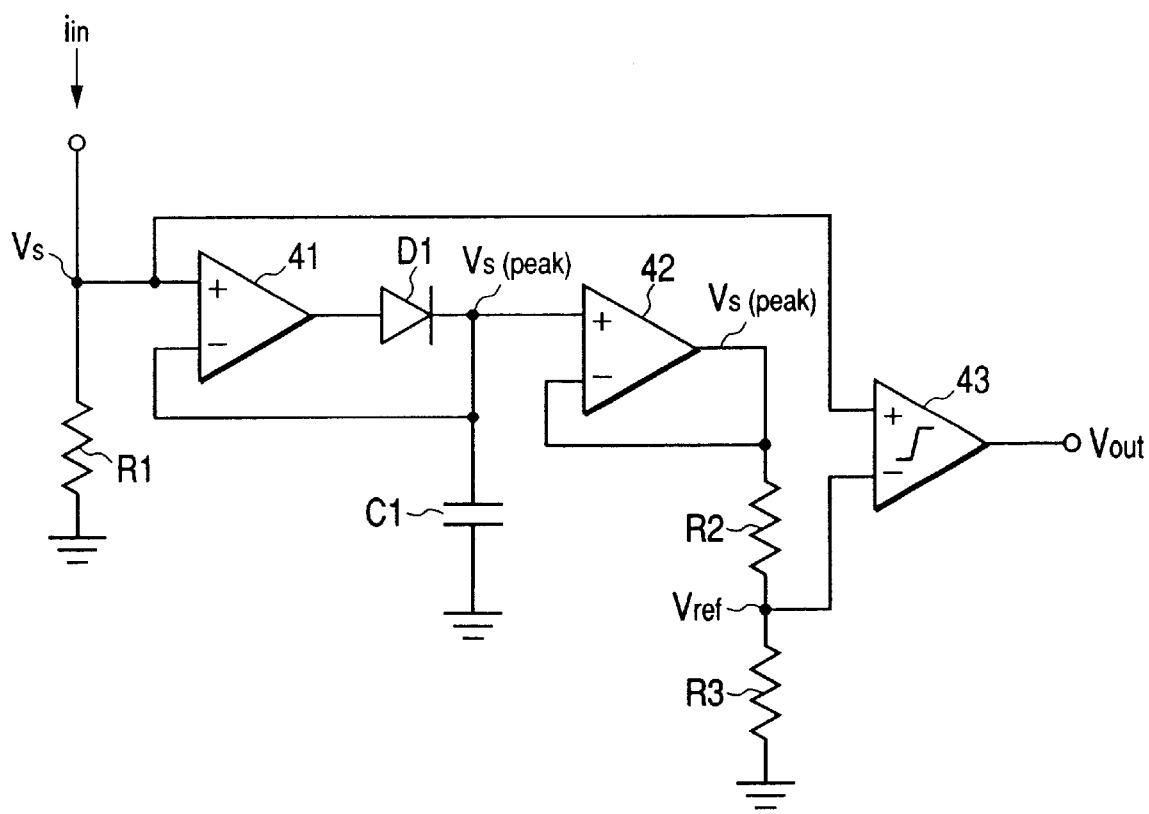
FIG. 1 is a schematic block diagram showing one example of a current-voltage converter.
Figure 2:
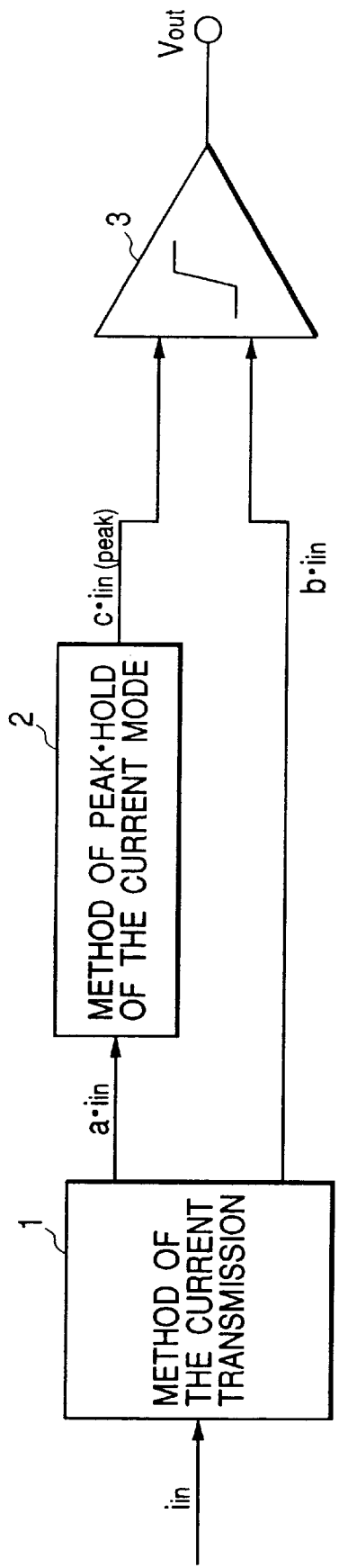
FIG. 2 is a schematic block diagram showing one example of the present invention.

FIG. 2 is a schematic block diagram showing one preferred embodiment of a current-voltage converter of the present invention.

In FIG. 2, current transmission means 1 has a function of outputting a plurality of current signals proportional to an inputted current signal $i_{in}$. Current mode peak hold means 2 inputs current $a \cdot i_{in}$ proportional to the input current $i_{in}$ outputted from the current transmission means 1, and outputs a current $c \cdot i_{in(peak)}$ proportional to a peak value of $a \cdot i_{in}$.

Moreover, in current comparison means 3 of a voltage output, in which an input is a current signal, and an output is a voltage pulse, one input is a current $b \cdot i_{in}$ proportional to the input current $i_{in}$ outputted from the current transmission means 1, and another input is the current $c \cdot i_{in(peak)}$ outputted from the current mode peak hold means 2. The current comparison means 3 outputs a high or low level voltage $V_{out}$ in accordance with a size relation between these two inputs.

Figure 3:
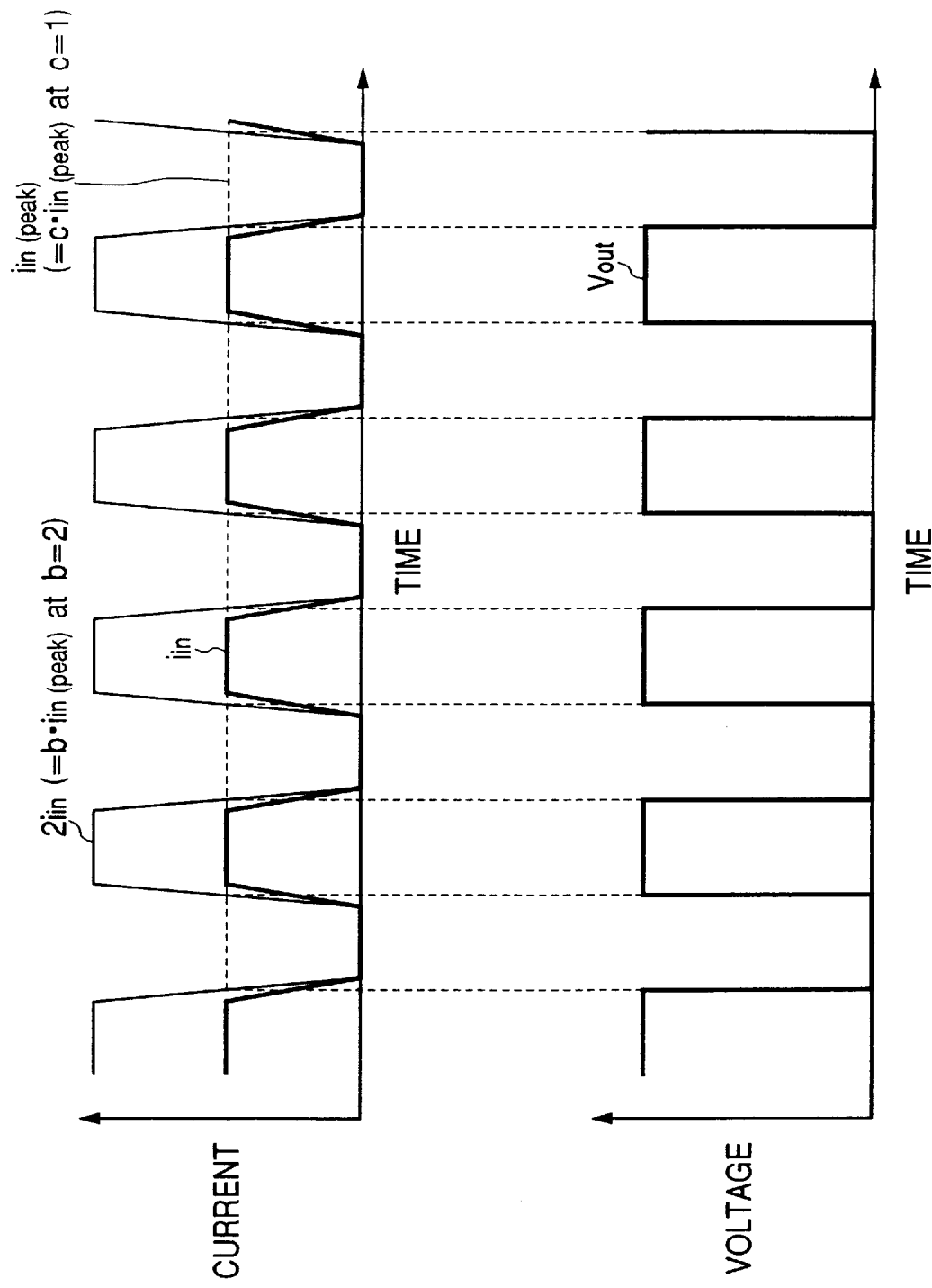
FIG. 3 is a current waveform diagram and voltage waveform diagram showing an operation of the present invention.

In order to describe an operation of the embodiment, FIG. 3 is a waveform diagram of the input current $i_{in}$, currents $a \cdot i_{in}$ and $b \cdot i_{in}$ outputted from the current transmission means 1, current $c \cdot i_{in(peak)}$ outputted from the current mode peak hold means 2, and output voltage $V_{out}$ of the current comparison means 3. Here, for the sake of simplicity, a=c=1, b=2, and the input current $i_{in}$ is a pulse train with a constant amplitude. In the present embodiment since the output current of the current mode peak hold means 2 is $i_{in(peak)}$, and output current of the current transmission means 1 is 2 $i_{in}$, the threshold value of the current comparison means 3 is ½ of the peak value of the input current $i_{in}$, and the output voltage $V_{out}$ changes as shown in FIG. 3.

Additionally, as seen from the present embodiment, the threshold value of the current comparison means 3 is defined by c/b of the peak value of the input current $i_{in}$, and by setting these values to desired values, the current-voltage converter can be provided in which the threshold value changes to indicate the constant ratio in accordance with the peak value of the input current.

Figure 4:
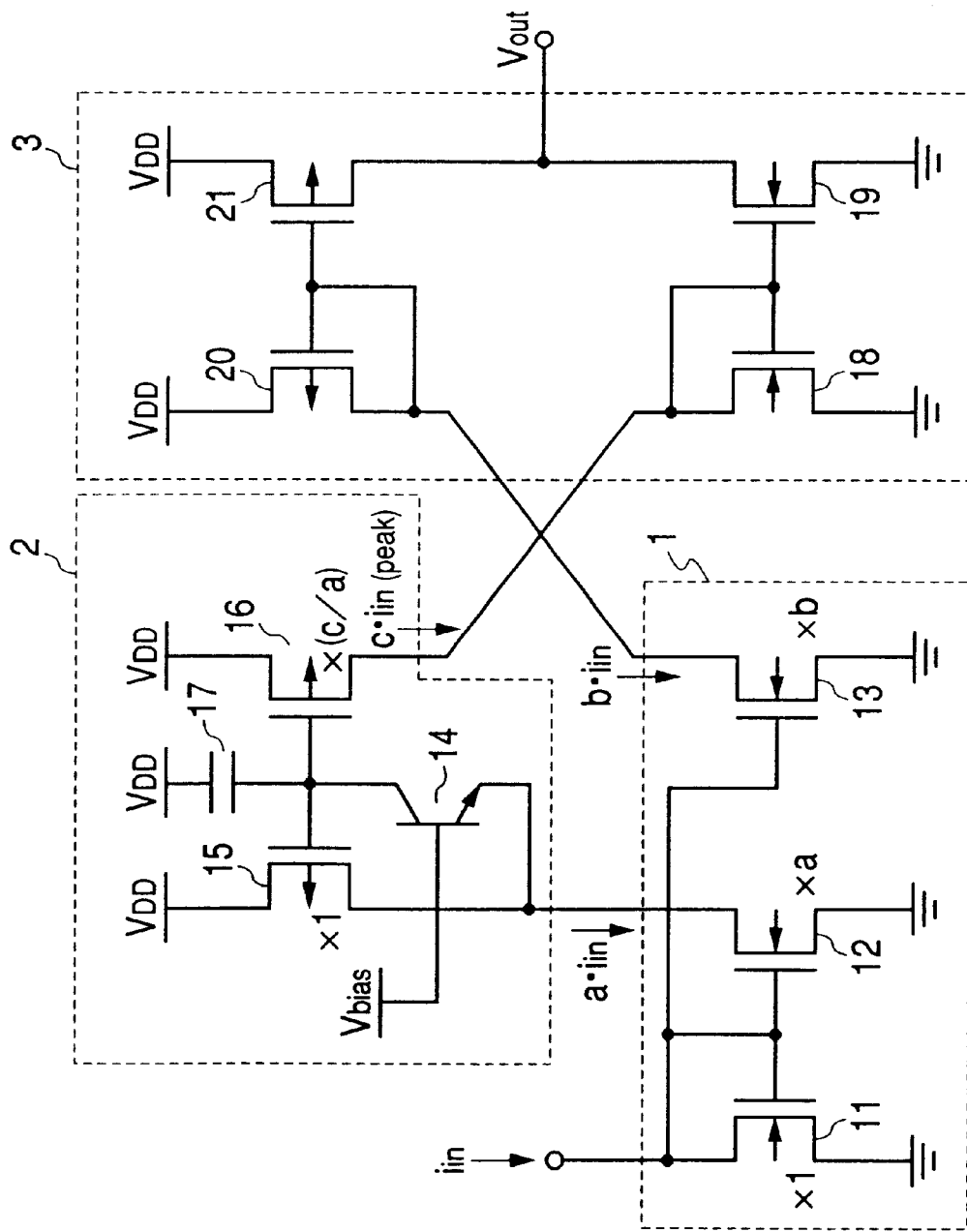
FIG. 4 is a diagram of a circuit example in which the block diagram shown in FIG. 1 is more concretely shown.

Moreover, FIG. 4 is a schematic circuit diagram showing a circuit example in which the present invention shown in the aforementioned block diagram is more concretely shown, but in the currents $i_{in}$, $a \cdot i_{in}$, $b \cdot i_{in}$, $c \cdot i_{in(peak)}$ of FIG. 4, by defining directions of arrows indicating the respective currents to be positive, a matching property with the block diagram shown in FIG. 2 is achieved. In FIG. 4, a current mirror circuit 1 as the current transmission means is constituted of NMOS transistors 11, 12, 13. As shown in FIG. 4, an input side electrode and gate electrode of the NMOS transistor 11 of an input portion are electrically connected to gate electrodes of the NMOS transistors 12, 13. Moreover, one main electrode of each of the NMOS transistors 11, 12 and 13 is connected to a predetermined potential (earth or the like). In proportion to the input current $i_{in}$ inputted to the NMOS transistor 11, the respective currents $a \cdot i_{in}$, $b \cdot i_{in}$ can be outputted for the NMOS transistors 12, 13.

Here, a, b can be set to desired values by changing a ratio W/L of a gate width W to a gate length L of the NMOS transistors 11, 12, 13 constituting the current mirror circuit. Specifically, when the gate width and gate length of the NMOS transistor 11 are $W_{11}$, $L_{11}$, the gate width and gate length of the NMOS transistor 12 are $W_{12}$, $L_{12}$, and the gate width and gate length of the NMOS transistor 13 are $W_{13}$, $L_{13}$, a relation is $(W_{11}/L_{11}):(W_{12}/L_{12}):(W_{13}/L_{13})=1:a:b$.

Moreover, the current mode peak hold means 2 is constituted of an NPN transistor 14, PMOS transistors 15, 16, and capacity 17. Gate electrodes of two PMOS transistors 15, 16 are electrically connected to each other, and one of main electrodes is connected to a power source $V_{DD}$. Moreover, these gate electrodes are electrically connected to one electrode of the capacity 17 and one of the main electrodes of the NPN transistor 14. The other electrode of the capacity is connected to the power source $V_{DD}$. The other main electrode of the PMOS transistor 15 and one of the main electrodes of the NPN transistor 14 are connected to the main electrode of the NMOS transistor 12.

It is seen that in accordance with the peak value of the input current $a \cdot i_{in}$ drawn into the current mirror circuit, a potential of a common gate terminal of the PMOS transistors 15, 16 having supplied the power source $V_{DD}$ to a source is lowered, the peak is held by the capacity 17 whose one end is connected to the power source $V_{DD}$, and thereby the current $c \cdot i_{in(peak)}$ proportional to the peak value of the inputted current value $a \cdot i_{in}$ is outputted from the PMOS transistor 16.

Here, c can be set to a desired value by changing the ratio W/L of the gate width W to the gate length L of the PMOS transistors 15, 16. Specifically, when the gate width and gate length of the PMOS transistor 15 are $W_{15}$, $L_{15}$, and the gate width and gate length of the PMOS transistor 16 are $W_{16}$, $L_{16}$, a relation is $(W_{15}/L_{15}):(W_{16}/L_{16})=a:c$.

In the current comparison means 3 of the current input with the voltage output, a pair of current mirror circuits are formed, and the respective sources are constituted of NMOS transistors 18, 19 connected to a ground potential of a reference potential point, similarly PMOS transistors 20, 21 form a pair of current mirror circuits and respective sources are connected to the power source $V_{DD}$. Since a drain current of the NMOS transistor 19 agrees with that of the PMOS transistor 21, and when a relation of two input currents is current $c \cdot i_{in(peak)} > b \cdot i_{in}$, in order to operate the NMOS transistor 19 in a triode area the output voltage $V_{out}$ is lowered toward the ground potential. Conversely, it is seen that when a relation of two input currents is $c \cdot i_{in(peak)} < b \cdot i_{in}$, in order to operate the PMOS transistor 21 in the triode area, the output voltage $V_{out}$ rises toward the power potential $V_{DD}$.

It is seen from the above description that the circuit of FIG. 4 shows a circuit example more concretely than the block diagram shown in FIG. 2. The current waveform or the voltage waveform of each portion shown in FIG. 4 has a relation similar to the relation between the input current and the output voltage shown in FIG. 3.

Moreover, in the present embodiment, similarly as FIG. 2, FIG. 4 also shows an example in which the threshold value of the current comparison means 3 is (c/b)=(½) of the peak value of the input current $i_{in}$, and by setting the desired values of these values to separate values, the threshold value changes to indicate the constant ratio in accordance with the peak value of the input current, and the object can be achieved with a smaller circuit scale.

Figure 5:
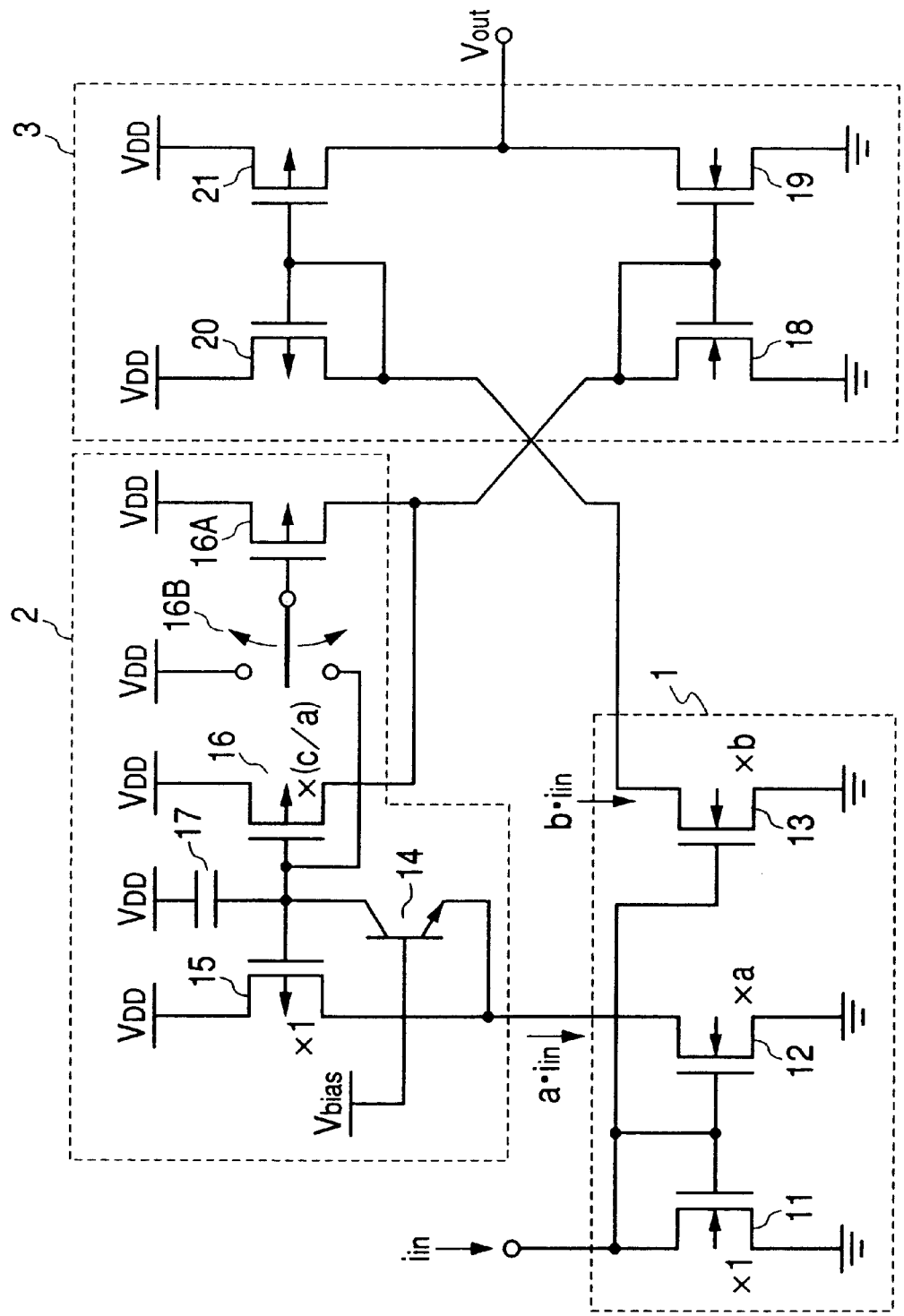
FIG. 5 is a block diagram showing a second embodiment of the present invention.
Figure 6:
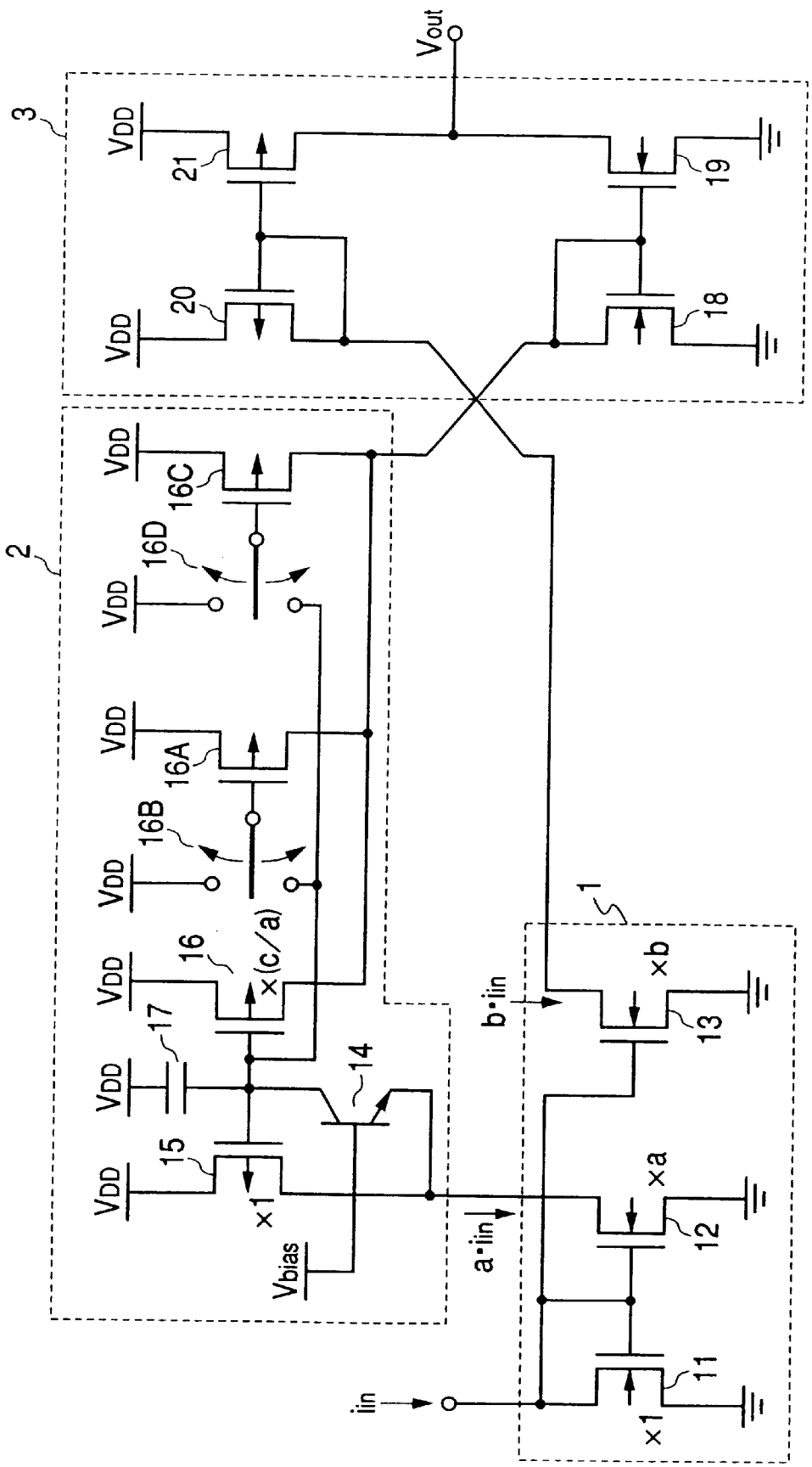
FIG. 6 is a diagram showing a circuit example in which the block diagram shown in FIG. 4 is more concretely shown.

FIG. 5 shows one example of a circuit in which a value of proportionality constant c/b in determining the threshold value can be selected, and is a circuit constituted by adding a PMOS transistor 16A with the same size as that of the PMOS transistor 16, and switching element 16B to the circuit of FIG. 4. When a gate of the PMOS transistor 16A is a power potential $V_{DD}$ by the switching element 16B, the PMOS transistor 16A passes no current and indicates the same effect as that of the circuit of FIG. 4. On the other hand, when the gate of the PMOS transistor 16 and the gate of the PMOS transistor 16A are connected in common by the switching element 16B, the current mode peak hold means 2 outputs a current of $2c \cdot i_{in(peak)}$ and the threshold value of the current comparison means 3 is (2c/b) of the peak value of the input current $i_{in}$, so that the proportionality constant in determining the threshold value can be selected. Additionally, in the present embodiment the size of the PMOS transistor 16A is the same as that of the PMOS transistor 16, but the size may of course be different. Furthermore, in the present embodiment, only the PMOS transistor 16A and switching element 16B are added to FIG. 4, but a plurality of elements can further be added in parallel. FIG. 6 shows a circuit constituted by adding a PMOS transistor 16C and a switching element 16D. In this case, the proportionality constant in determining the threshold value can be selected further in multiple stages.

Moreover, in the present embodiment the elements are added parallel to the PMOS transistor 16, but the same effect can be obtained even if the elements are added in parallel to the PMOS transistor 15.

Figure 7:
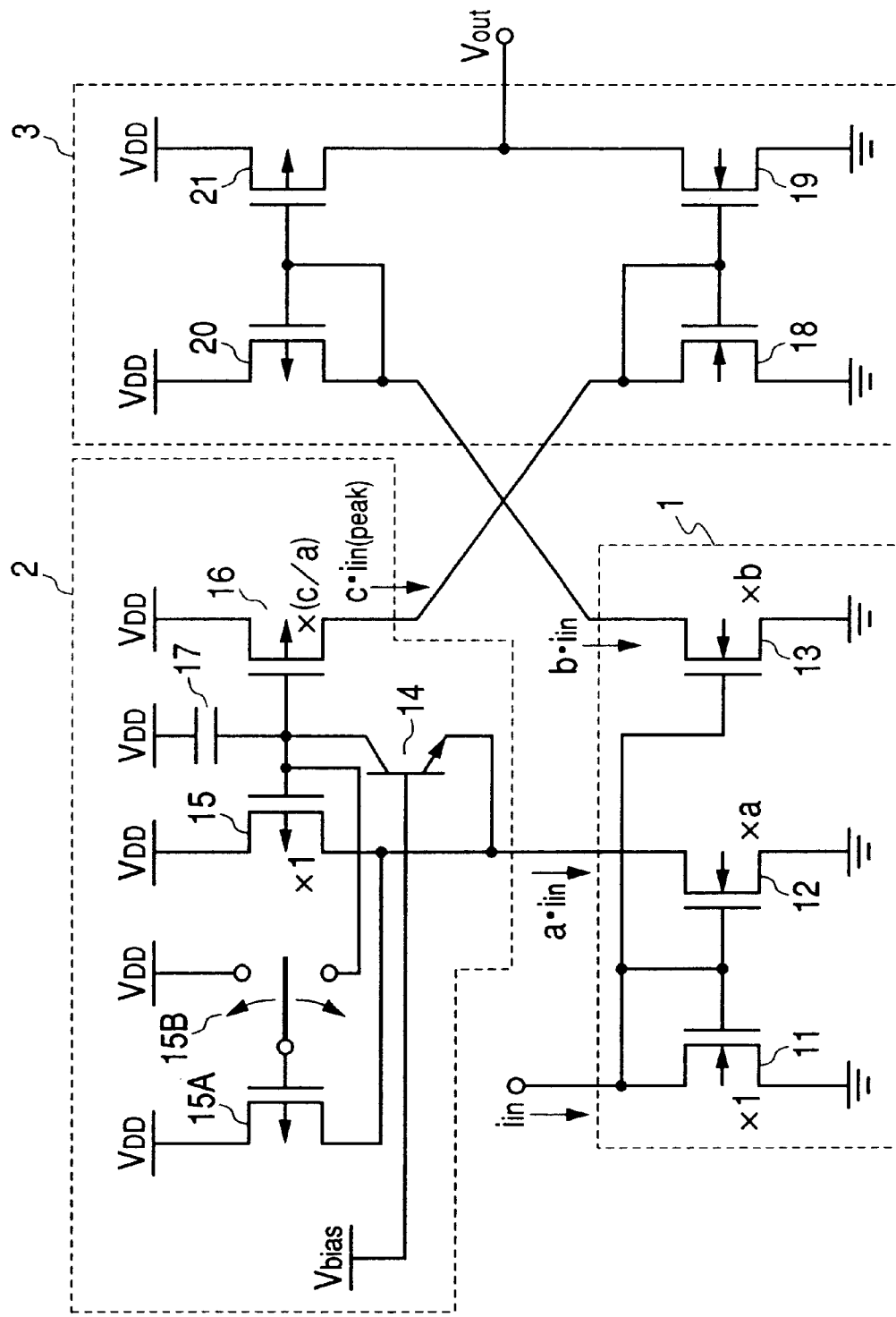
FIG. 7 is a diagram of a circuit in which a proportionality constant during determination of a threshold value can be selected.

FIG. 7 shows a circuit in which a PMOS transistor 15A and switching element 15B are added. When the size of the PMOS transistor 15A is the same as that of the PMOS transistor 15, and when the gate of the PMOS transistor 15A indicates the power potential $V_{DD}$ by the switching element 15B, the PMOS transistor 15A passes no current and the same effect as that of the circuit of FIG. 4 is indicated. On the other hand, when the gate of the PMOS transistor 15 and the gate of the PMOS transistor 15A are connected in common by the switching element 15B, the current mode peak hold means 2 outputs a current of $c \cdot i_{in(peak)}/2$ and the threshold value of the current comparison means 3 is (c/2b) of the peak value of the input current $i_{in}$, so that the proportionality constant in determining the threshold value can be selected.

Figure 8:
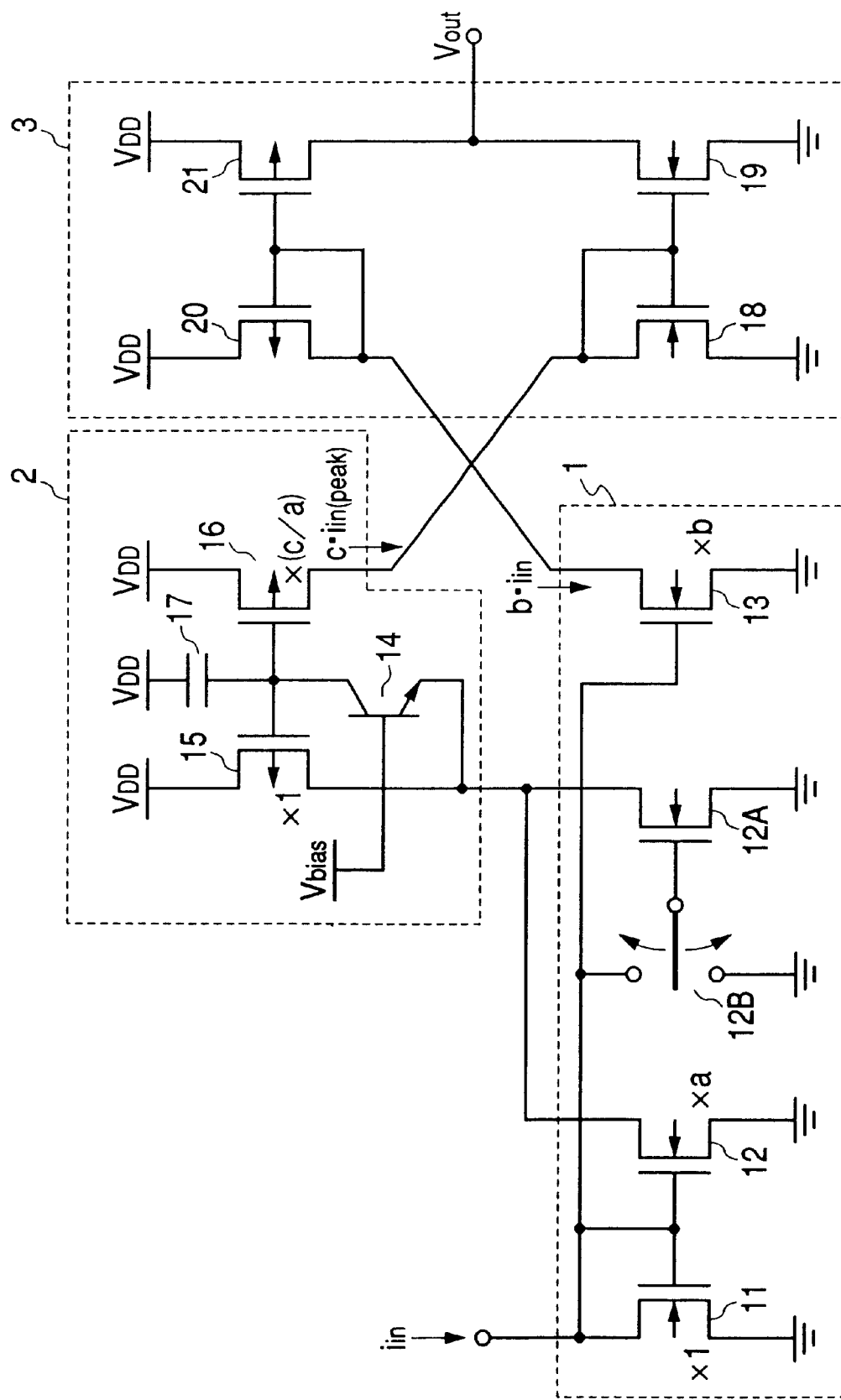
FIG. 8 is a diagram of the circuit in which the proportionality constant during determination of the threshold value can be selected.

Moreover, even when the elements are added parallel to the NMOS transistor 12, the same effect can be obtained. FIG. 8 shows a circuit in which an NMOS transistor 12A and switching element 12B are added. When the size of the NMOS transistor 12A is the same as that of the NMOS transistor 12, and when the gate of the NMOS transistor 12A indicates the ground potential by the switching element 12B, the NMOS transistor 12A passes no current and the same effect as that of the circuit of FIG. 4 is indicated. On the other hand, when the gate of the NMOS transistor 12 and the gate of the NMOS transistor 12A are connected in common by the switching element 12B, the current mode peak hold means 2 outputs a current of $2c \cdot i_{in(peak)}$ and the threshold value of the current comparison means 3 is (2c/b) of the peak value of the input current $i_{in}$, so that the proportionality constant in determining the threshold value can be selected.

Figure 9:
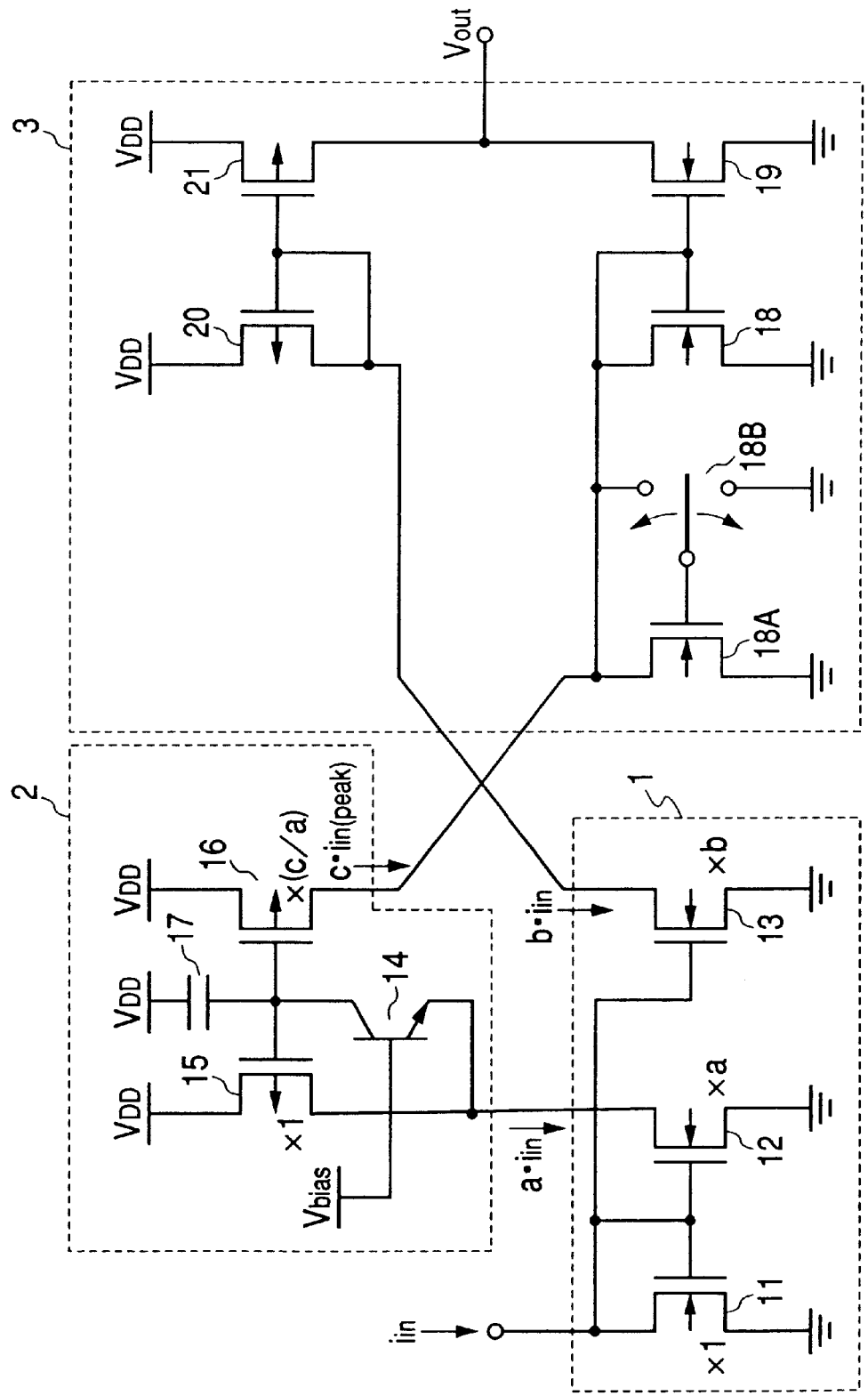
FIG. 9 is a diagram of the circuit in which the proportionality constant during determination of the threshold value can be selected.

Even when the elements are added parallel to the NMOS transistor 18, the same effect can be obtained. FIG. 9 shows a circuit in which an NMOS transistor 18A and switching element 18B are added. When the size of the NMOS transistor 18A is the same as that of the NMOS transistor 18, and when the gate of the NMOS transistor 18A indicates the ground potential by the switching element 18B, the NMOS transistor 18A passes no current and the same effect as that of the circuit of FIG. 4 is indicated. On the other hand, when the gate of the NMOS transistor 18 and the gate of the NMOS transistor 18A are connected in common by the switching element 18B, the threshold value of the current comparison means 3 is (c/2b) of the peak value of the input current $i_{in}$, so that the proportionality constant in determining the threshold value can be selected.

Figure 10:
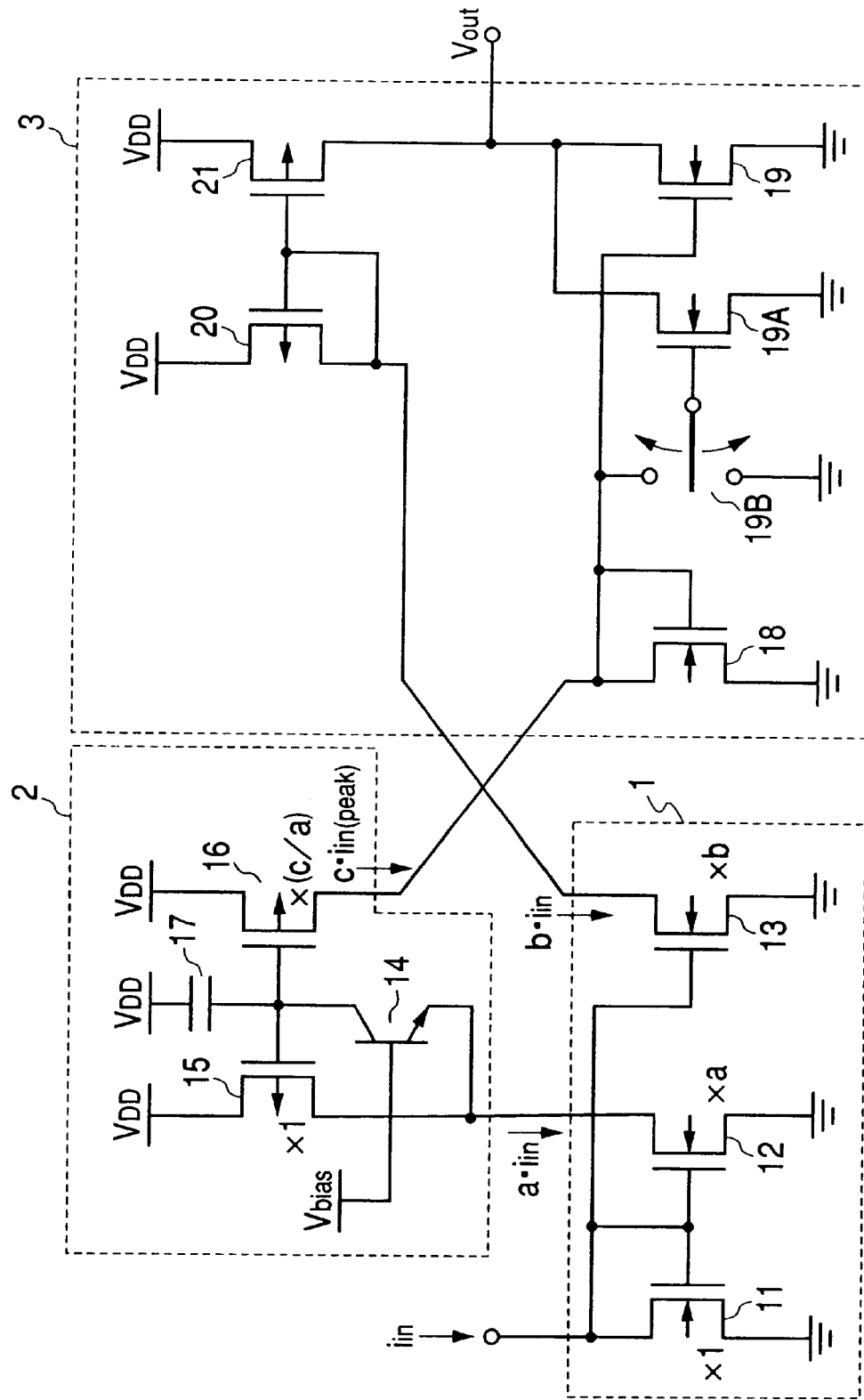
FIG. 10 is a diagram of the circuit in which the proportionality constant during determination of the threshold value can be selected.

Even when the elements are added parallel to the NMOS transistor 19, the same effect can be obtained. FIG. 10 shows a circuit in which an NMOS transistor 19A and switching element 19B are added. When the size of the NMOS transistor 19A is the same as that of the NMOS transistor 19, and when the gate of the NMOS transistor 19A indicates the ground potential by the switching element 19B, the NMOS transistor 19A passes no current and the same effect as that of the circuit of FIG. 3 is indicated. On the other hand, when the gate of the NMOS transistor 19 and the gate of the NMOS transistor 19A are connected in common by the switching element 19B, the threshold value of the current comparison means 3 is (2c/b) of the peak value of the input current $i_{in}$, so that the proportionality constant in determining the threshold value can be selected.

Figure 11:
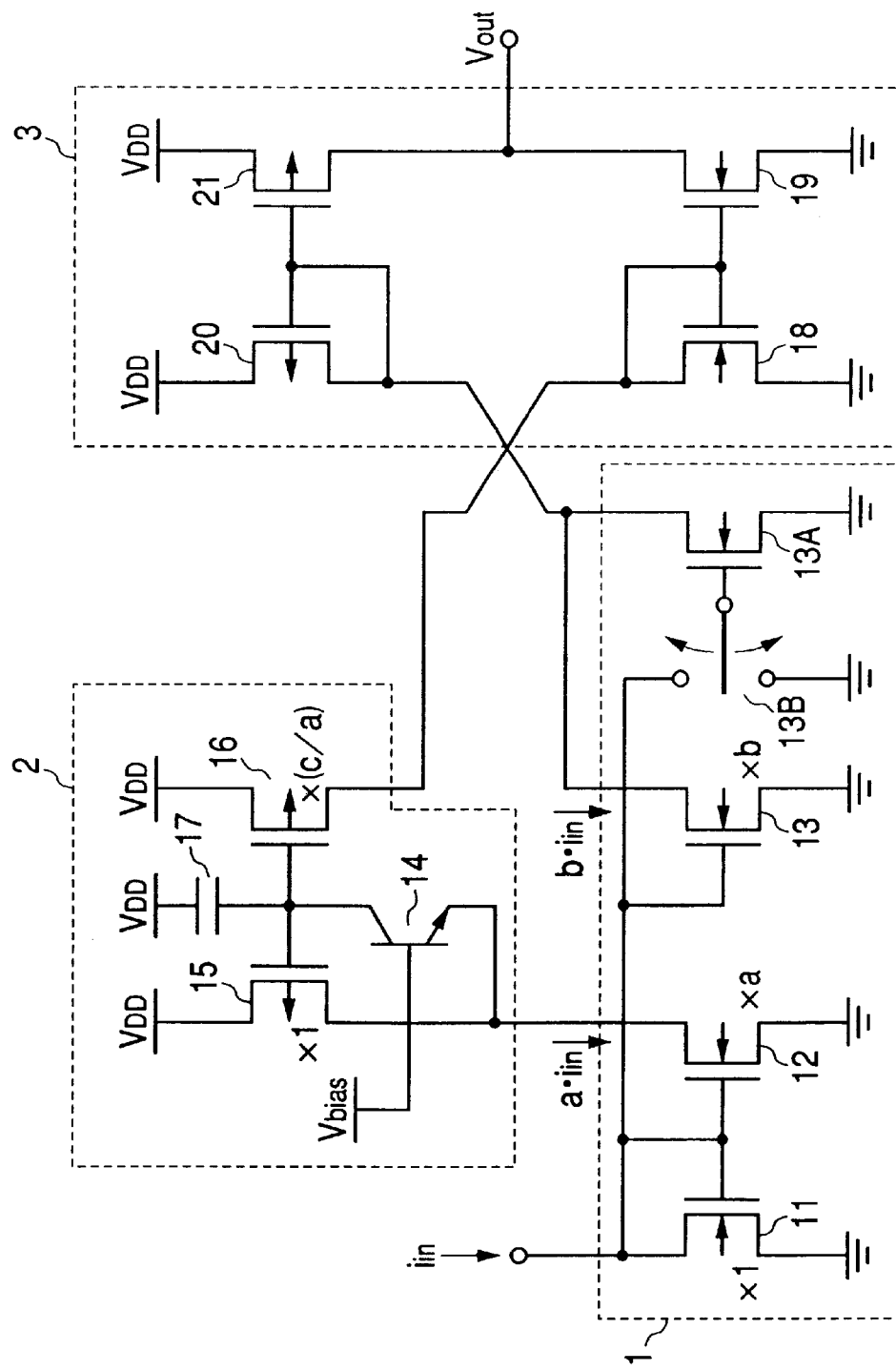
FIG. 11 is a diagram of the circuit in which the proportionality constant during determination of the threshold value can be selected.

FIG. 11 shows one example of the circuit in which the value of the proportionality constant c/b in determining the threshold value can be selected, and is a circuit constituted by adding an NMOS transistor 13A with the same size as that of the NMOS transistor 13, and switching element 13B to the circuit of FIG. 4. When the gate of the NMOS transistor 13A is the ground potential by the switching element 13B, the NMOS transistor 13A passes no current and indicates the same effect as that of the circuit of FIG. 4. On the other hand, when the gate of the NMOS transistor 13 and the gate of the NMOS transistor 13A are connected in common by the switching element 13B, the current transmission means 1 outputs a current of $2b \cdot i_{in}$ and the threshold value of the current comparison means 3 is (c/2b) of the peak value of the input current $i_{in}$, so that the proportionality constant in determining the threshold value can be selected. Additionally, in the present embodiment the size of the NMOS transistor 13A is the same as that of the NMOS transistor 13, but the size may of course be different.

Furthermore, in the present embodiment, only the NMOS transistor 13A and switching element 13B are added to FIG.

Figure 12:
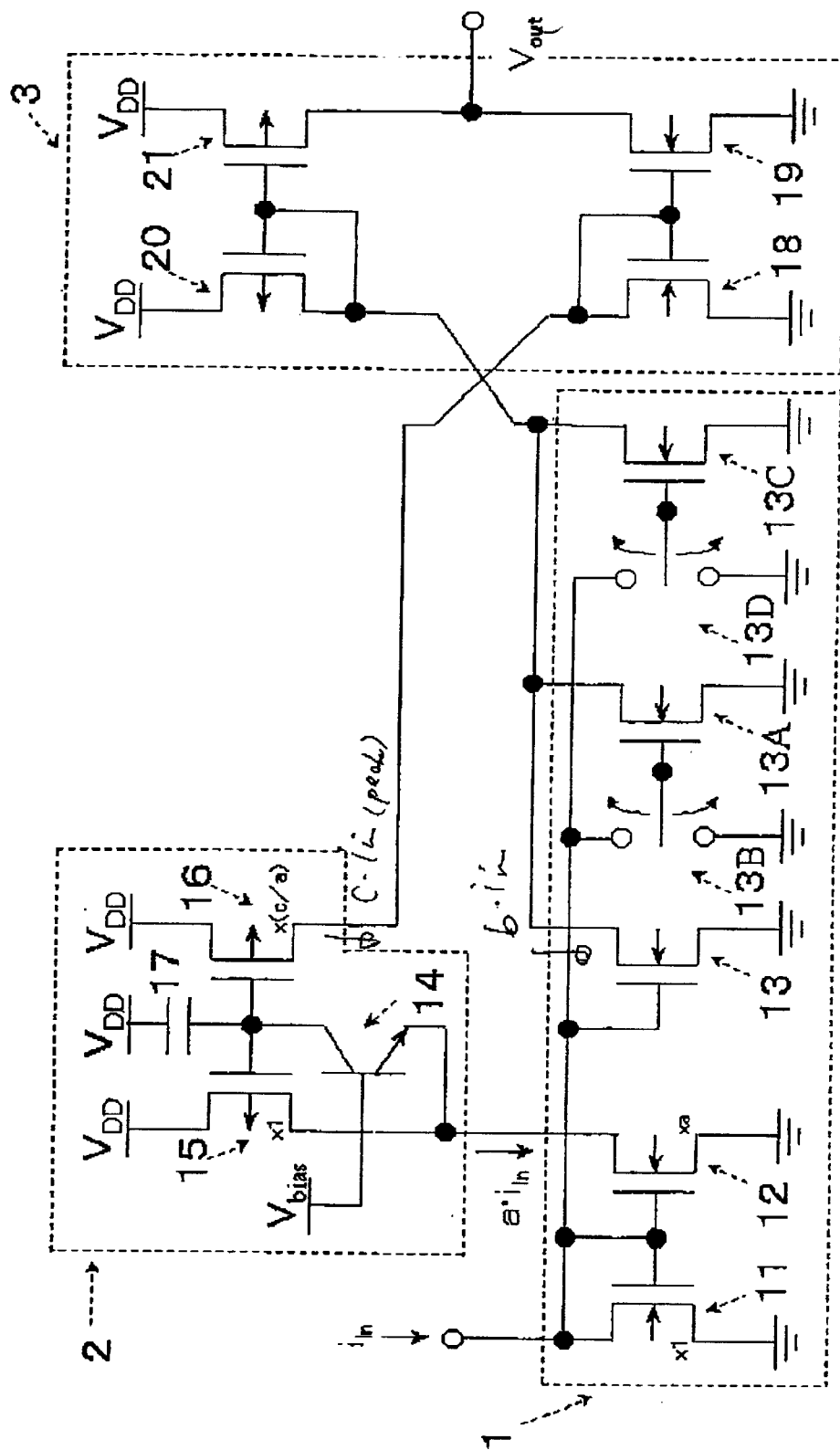
FIG. 12 is a diagram of the circuit in which the proportionality constant during determination of the threshold value can be selected.

4, but a plurality of elements can further be added in parallel. FIG. 12 shows a circuit constituted by adding an NMOS transistor 13C and a switching element 13D. In this case, the proportionality constant in determining the threshold value can be selected further in multiple stages.

Figure 13:
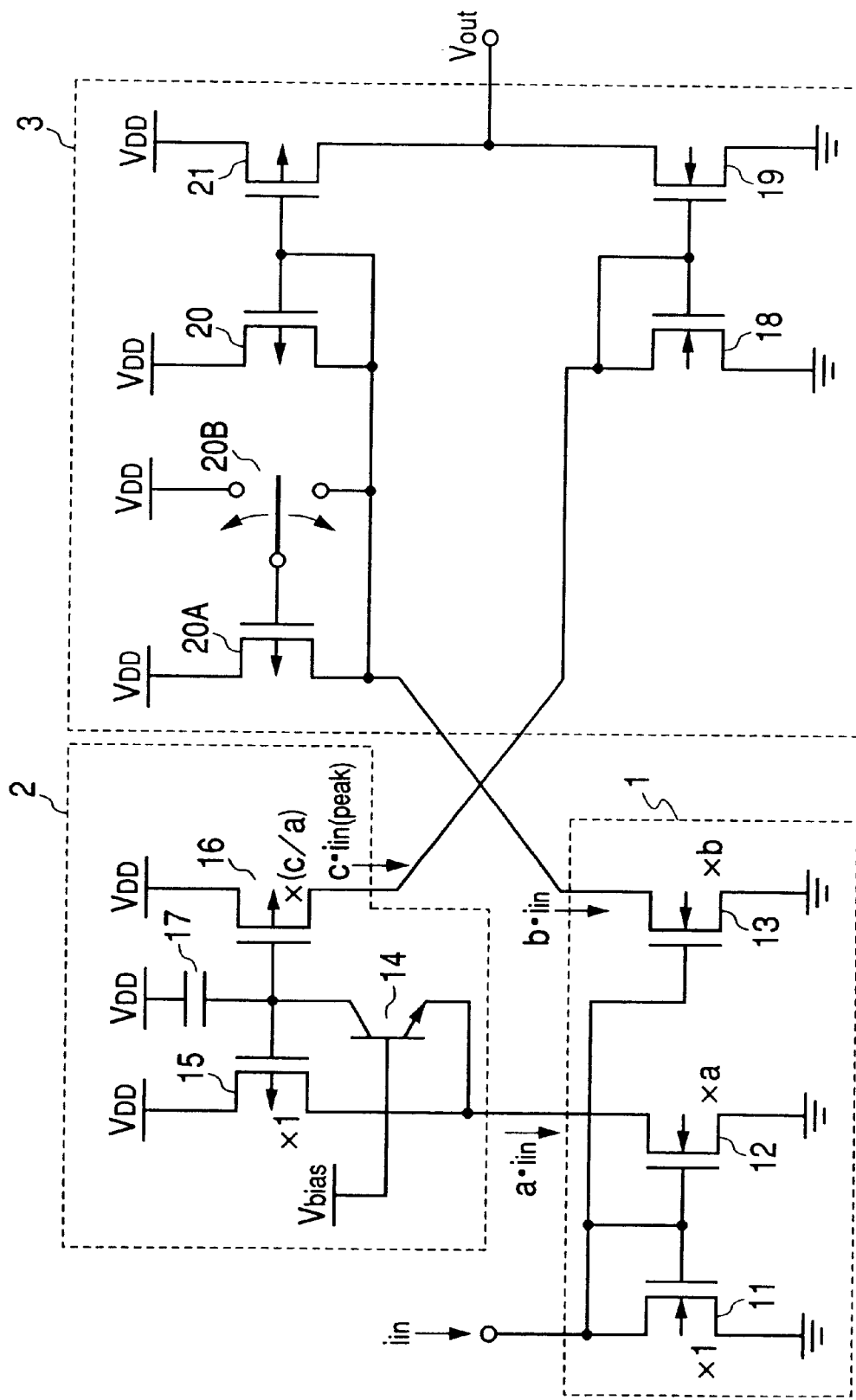
FIG. 13 is a diagram of the circuit in which the proportionality constant during determination of the threshold value can be selected.

Moreover, in the present embodiment the elements are added parallel to the NMOS transistor 13, but the same effect can be obtained even if the elements are added in parallel to the PMOS transistor 20. FIG. 13 shows a circuit in which a PMOS transistor 20A and switching element 20B are added. When the size of the PMOS transistor 20A is the same as that of the PMOS transistor 20, and when the gate of the PMOS transistor 20A indicates the power potential $V_{DD}$ by the switching element 20B, the PMOS transistor 20A passes no current and the same effect as that of the circuit of FIG. 4 is indicated. On the other hand, when the gate of the PMOS transistor 20 and the gate of the PMOS transistor 20A are connected in common by the switching element 20B, the threshold value of the current comparison means 3 is (2c/b) of the peak value of the input current $i_{in}$, so that the proportionality constant in determining the threshold value can be selected.

Figure 14:
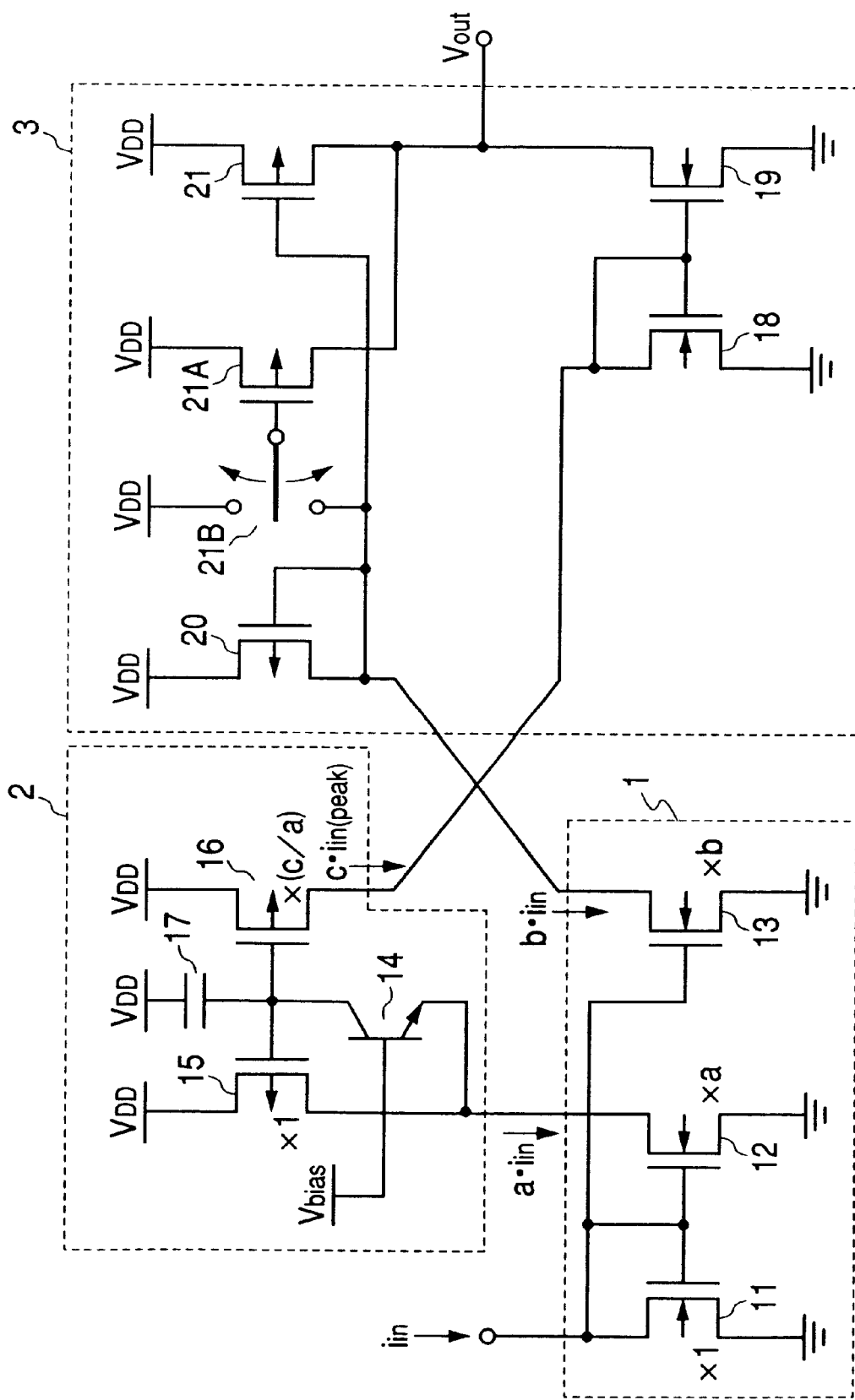
FIG. 14 is a diagram of the circuit in which the proportionality constant during determination of the threshold value can be selected.

Even when the elements are added parallel to the PMOS transistor 21, the same effect can be obtained. FIG. 14 shows a circuit in which a PMOS transistor 21A and switching element 21B are added. When the size of the PMOS transistor 21A is the same as that of the PMOS transistor 21, and when the gate of the PMOS transistor 21A indicates the power potential $V_{DD}$ by the switching element 21B, the PMOS transistor 21A passes no current and the same effect as that of the circuit of FIG. 4 is indicated. On the other hand, when the gate of the PMOS transistor 21 and the gate of the PMOS transistor 21A are connected in common by the switching element 21B, the threshold value of the current comparison means 3 is (c/2b) of the peak value of the input current $i_{in}$, so that the proportionality constant in determining the threshold value can be selected.

Figure 15:
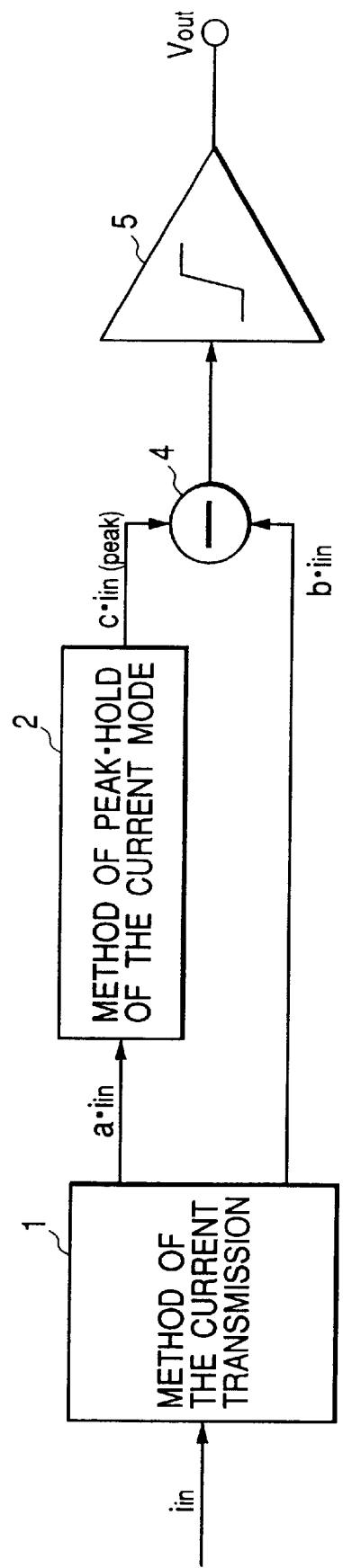
FIG. 15 is a diagram of the circuit in which the proportionality constant during determination of the threshold value can be selected.

FIG. 15 is a schematic block diagram showing another preferred embodiment of the current-voltage converter of the present invention.

In FIG. 15, the current transmission means 1 has a function of outputting a plurality of current signals proportional to the inputted current signal $i_{in}$. The current mode peak hold means 2 inputs the current $a \cdot i_{in}$ proportional to the input current $i_{in}$ outputted from the current transmission means 1, and outputs the current $c \cdot i_{in(peak)}$ proportional to the peak value of $a \cdot i_{in}$. In current subtraction means 4, one input is a current $b \cdot i_{in}$ proportional to the input current $i_{in}$ outputted from the current transmission means 1, and another input is the current $c \cdot i_{in(peak)}$ outputted from the current mode peak hold means 2. Here, the current outputted from the current subtraction means 4 is reversed to be positive or negative in accordance with a size relation between two input currents $b \cdot i_{in}$ and $c \cdot i_{in(peak)}$. Additionally, here for the same of convenience $c \cdot i_{in(peak)}$ $b \cdot i_{in}$ is defined as the output current from the current subtraction means 4. Current-voltage conversion means 5 inputs the current signal, outputs the voltage pulse, and has a function of outputting a high or low level voltage dependent upon whether the input current is positive or negative.

In order to describe an operation in the block diagram shown in FIG. 15, the waveform diagram of the input current $i_{in}$, currents $a \cdot i_{in}$ and $b \cdot i_{in}$ outputted from the current transmission means 1, current $c \cdot i_{in(peak)}$ outputted from the current mode peak hold means 2, and output voltage $V_{out}$ of the current-voltage conversion means 5 is as shown in FIG. 3.

Here, for the sake of simplicity, a=c=1, b=2, and the input current $i_{in}$ is the pulse train with the constant amplitude. In the present embodiment since the output current of the current mode peak hold means 2 is $i_{in(peak)}$, and output current of the current transmission means 1 is $2i_{in}$, the output current from the current subtraction means 4 is reversed to be positive or negative at a boundary of ½ of the peak value of the input current $i_{in}$, this value is used as the threshold value and the output voltage $V_{out}$ of the current-voltage conversion means 5 changes as shown in FIG. 3. Additionally, as seen from the present embodiment, the current $(c \cdot i_{in(peak)} - b \cdot i_{in})$ outputted from the current subtraction means 4 is reversed to be positive or negative at a boundary of c/b of the peak value of the input current $i_{in}$, and by setting these values to the desired values, the current-voltage converter can be provided in which the threshold value changes to indicate the constant ratio in accordance with the peak value of the input current.

Figure 16:
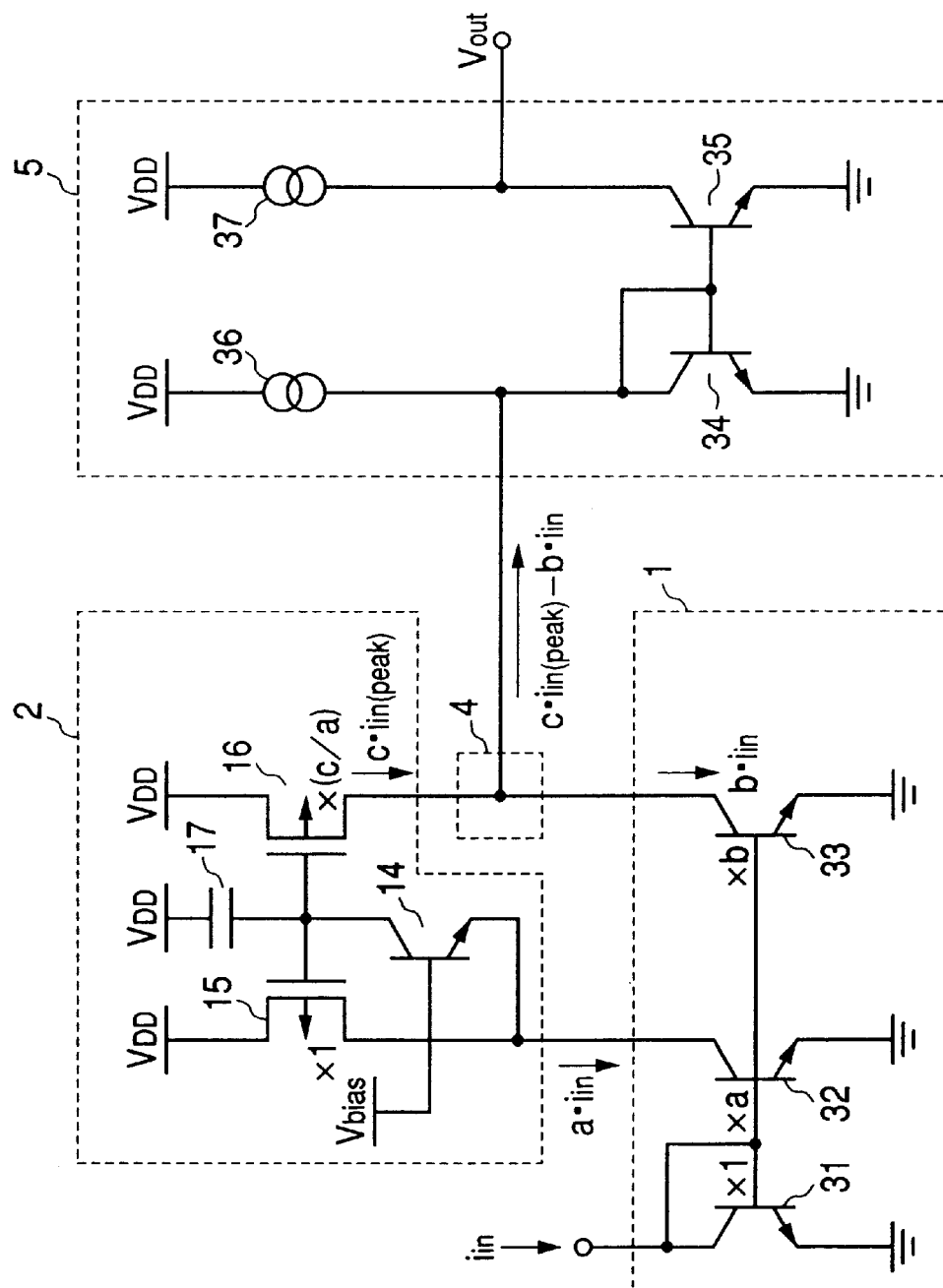
FIG. 16 is a diagram of the circuit in which the proportionality constant during determination of the threshold value can be selected.

Moreover, FIG. 16 shows a circuit example in which the present embodiment is more concretely shown. In the currents $i_{in}$, $a \cdot i_{in}$, $b \cdot i_{in}$, $c \cdot i_{in(peak)}$ of FIG. 16, by defining the directions of arrows indicating the respective currents to be positive, the matching property with the block diagram shown in FIG. 15 is achieved.

In FIG. 16, the current mirror circuit 1 as the current transmission means is constituted of NPN transistors 31, 32, 33, and it is seen that a plurality of currents $a \cdot i_{in}$, $b \cdot i_{in}$ proportional to the input current $i_{in}$ are outputted.

Here, a, b can be set to desired values by changing emitter areas of the NPN transistors 31, 32, 33 constituting the current mirror circuit. Specifically, when the emitter area of the NPN transistor 31 is $S_{31}$, the emitter area of the NPN transistor 32 is $S_{32}$, and the emitter area of the NPN transistor 33 is $S_{33}$, a relation is $S_{31}:S_{32}:S_{33}=1:a:b$.

Moreover, the current mode peak hold means 2 is constituted of the NPN transistor 14, PMOS transistors 15, 16, and capacity 17, and it is seen that in accordance with the peak value of the input current $a \cdot i_{in}$, the potential of the common gate terminal of the PMOS transistors 15, 16 is lowered, the peak is held by the capacity 17 whose one end is connected to the power source $V_{DD}$, and thereby the current $c \cdot i_{in(peak)}$ proportional to the peak value of the inputted current value $a \cdot i_{in}$ is outputted from the PMOS transistor 16.

Here, c can be set to the desired value by changing the ratio W/L of the gate width W to the gate length L of the PMOS transistors 15, 16. Specifically, when the gate width and gate length of the PMOS transistor 15 are $W_{15}$, $L_{15}$, and the gate width and gate length of the PMOS transistor 16 are $W_{16}$, $L_{16}$, a relation is $(W_{15}/L_{15}):(W_{16}/L_{16})=a:c$.

Moreover, the current-voltage conversion means 5, which outputs a high or low level voltage dependent upon whether the input current is positive or negative, is constituted of NPN transistors 34, 35 forming a pair of current mirror circuits, and constant current sources 36, 37. Since the current flowing through the constant current source 37 agrees with a collector current of the NPN transistor 35, and when the current is inputted in a positive direction shown by an arrow of FIG. 16, in order to operate the NPN transistor 35 in a saturation area the output voltage $V_{out}$ is lowered toward the ground potential. Conversely, it is seen that when the current of a negative direction is inputted, the output voltage $V_{out}$ rises toward the power potential $V_{DD}$ in a direction in which the constant current source 37 is cut off.

Moreover, the current subtraction means 4 is a connection portion for connecting an output terminal of the current mode peak hold means 2 to the output terminal of the current transmission means 1, and further by connection to an input terminal of the current-voltage conversion means 5 with a low input impedance, a difference current $c \cdot i_{in(peak)} - b \cdot i_{in}$ between the output current $c \cdot i_{in(peak)}$ of the current mode peak hold means 2 and the output current $b \cdot i_{in}$ of the current transmission means 1 can be supplied to the input terminal of the current-voltage conversion means 5.

Here, when the output current $c \cdot i_{in(peak)}$ of the current mode peak hold means 2 and the output current $b \cdot i_{in}$ of the current transmission means 1 has a relation of $c \cdot i_{in(peak)} > b \cdot i_{in}$, the current of the positive direction is supplied to the current-voltage conversion means 5 and $V_{out}$ outputs a low level voltage, and with $c \cdot i_{in(peak)} < b \cdot i_{in}$, the current of the negative direction is supplied to the current-voltage conversion means 5 and $V_{out}$ outputs a high level voltage.

It is seen from the above description that the circuit of FIG. 16 shows a circuit example more concretely than the block diagram shown in FIG. 15.

In the current-voltage conversion circuit according to the present embodiment, the constant current sources 36, 37 have been described as separate constant current sources in the current-voltage conversion means 5, but an MOS transistor can be used as a constant current source for supplying a constant bias voltage to the gate and supplying the power source $V_{DD}$ to the source to simplify the constitution, and as a result the current-voltage converter can be provided with a simple constitution.

Figure 17:
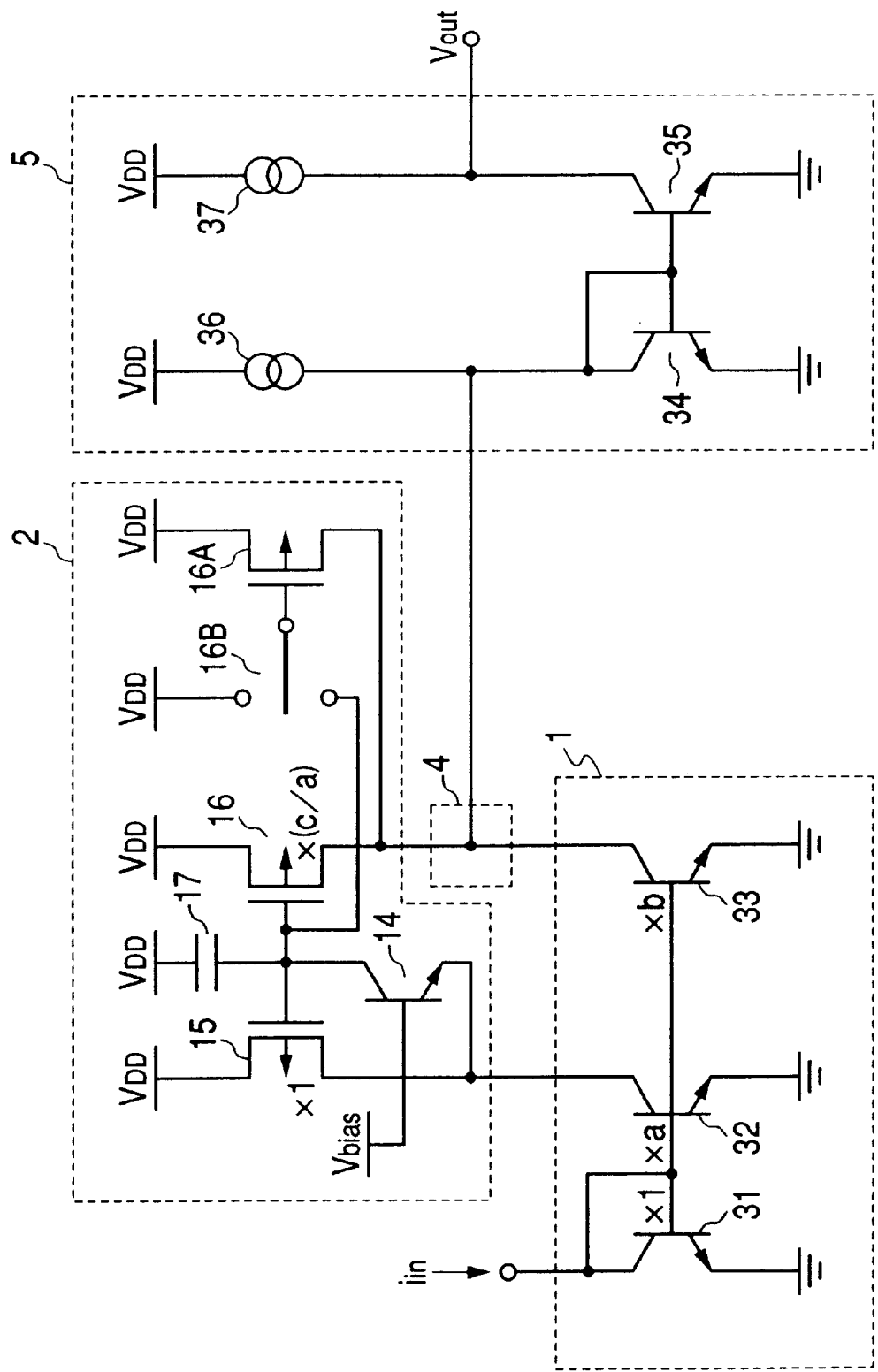
FIG. 17 is a diagram of the circuit in which the proportionality constant during determination of the threshold value can be selected.
Figure 18:
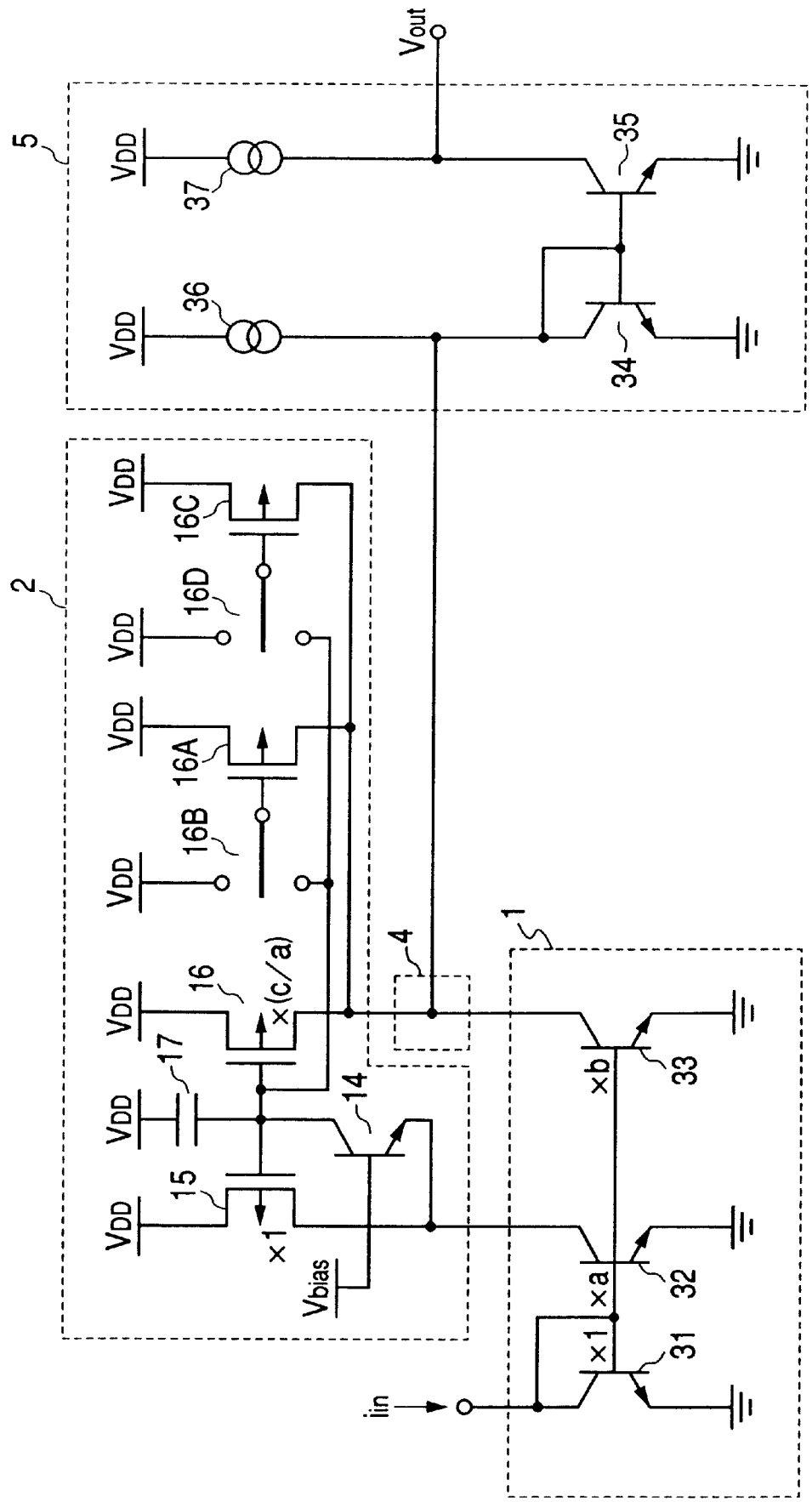
FIG. 18 is a diagram of the circuit in which the proportionality constant during determination of the threshold value can be selected.

FIG. 17 shows one example of the circuit in which the value of the proportionality constant c/b in determining the threshold value can be selected, and is a circuit constituted by adding the PMOS transistor 16A with the same size as that of the PMOS transistor 16, and switching element 16B to the circuit of FIG. 16. When the gate of the PMOS transistor 16A is the power potential $V_{DD}$ by the switching element 16B, the PMOS transistor 16A passes no current and indicates the same effect as that of the circuit of FIG. 16. On the other hand, when the gate of the PMOS transistor 16 and the gate of the PMOS transistor 16A are connected in common by the switching element 16B, the current mode peak hold means 2 outputs a current of $2c \cdot i_{in(peak)}$ and the threshold value of the current-voltage conversion means 5 is (2c/b) of the peak value of the input current $i_{in}$, so that the proportionality constant in determining the threshold value can be selected. Additionally, in the present embodiment the size of the PMOS transistor 16A is the same as that of the PMOS transistor 16, but the size may of course be different. Furthermore, in the present embodiment, only the PMOS transistor 16A and switching element 16B are added to FIG. 16, but a plurality of elements can further be added in parallel. FIG. 18 shows the circuit constituted by adding the PMOS transistor 16C and switching element 16D. In this case, the proportionality constant in determining the threshold value can be selected further in multiple stages.

Figure 19:
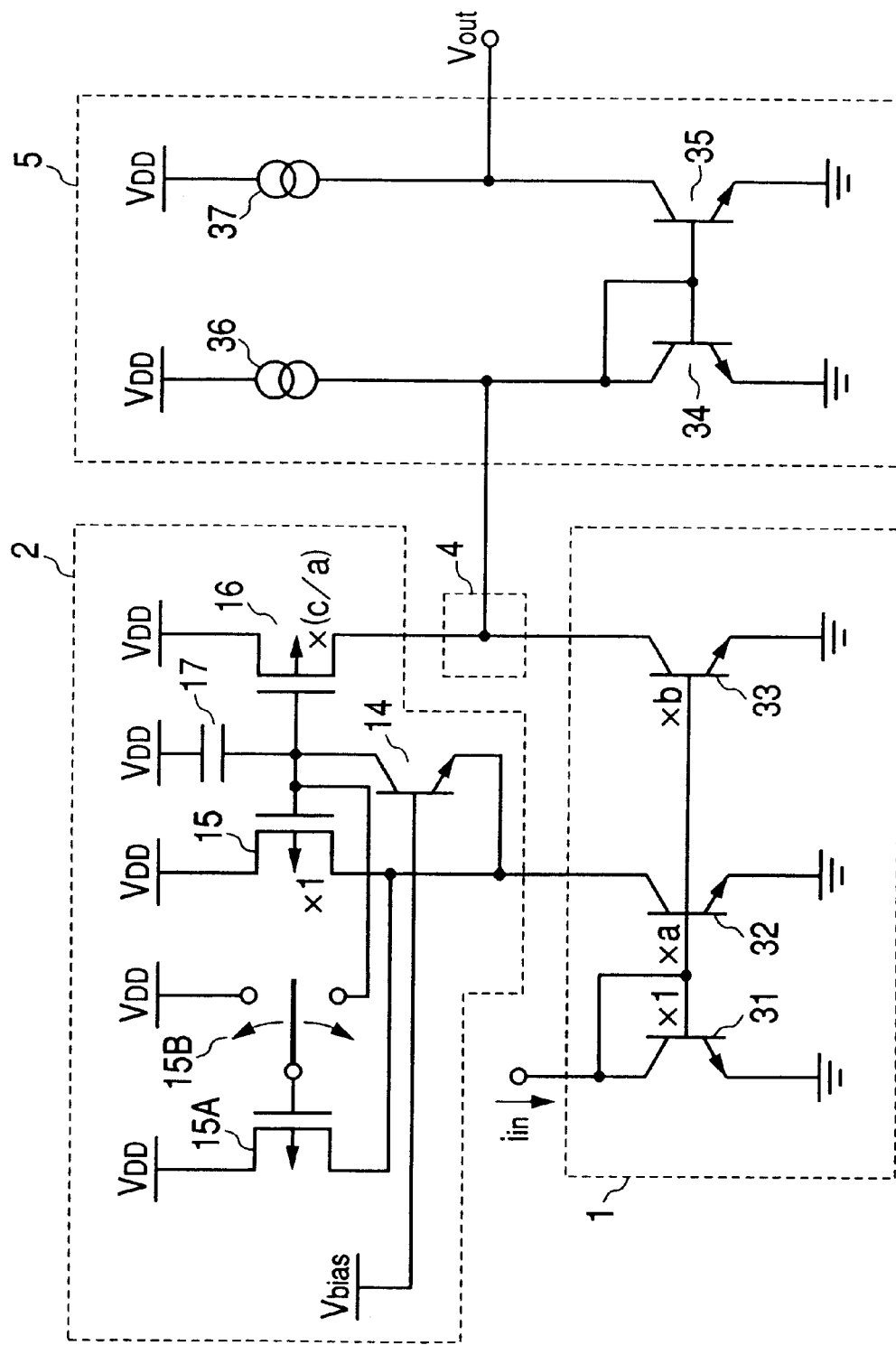
FIG. 19 is a diagram of the circuit in which the proportionality constant during determination of the threshold value can be selected.

Moreover, in the present embodiment the elements are added parallel to the PMOS transistor 16, but the same effect can be obtained even if the elements are added in parallel to the PMOS transistor 15. FIG. 19 shows the circuit in which the PMOS transistor 15A and switching element 15B are added. When the size of the PMOS transistor 15A is the same as that of the PMOS transistor 15, and when the gate of the PMOS transistor 15A indicates the power potential $V_{DD}$ by the switching element 15B, the PMOS transistor 15A passes no current and the same effect as that of the circuit of FIG. 16 is indicated. On the other hand, when the gate of the PMOS transistor 15 and the gate of the PMOS transistor 15A are connected in common by the switching element 15B, the current mode peak hold means 2 outputs a current of $c \cdot i_{in(peak)}/2$ and the threshold value of the current-voltage conversion means 5 is (c/2b) of the peak value of the input current $i_{in}$, so that the proportionality constant in determining the threshold value can be selected.

Figure 20:
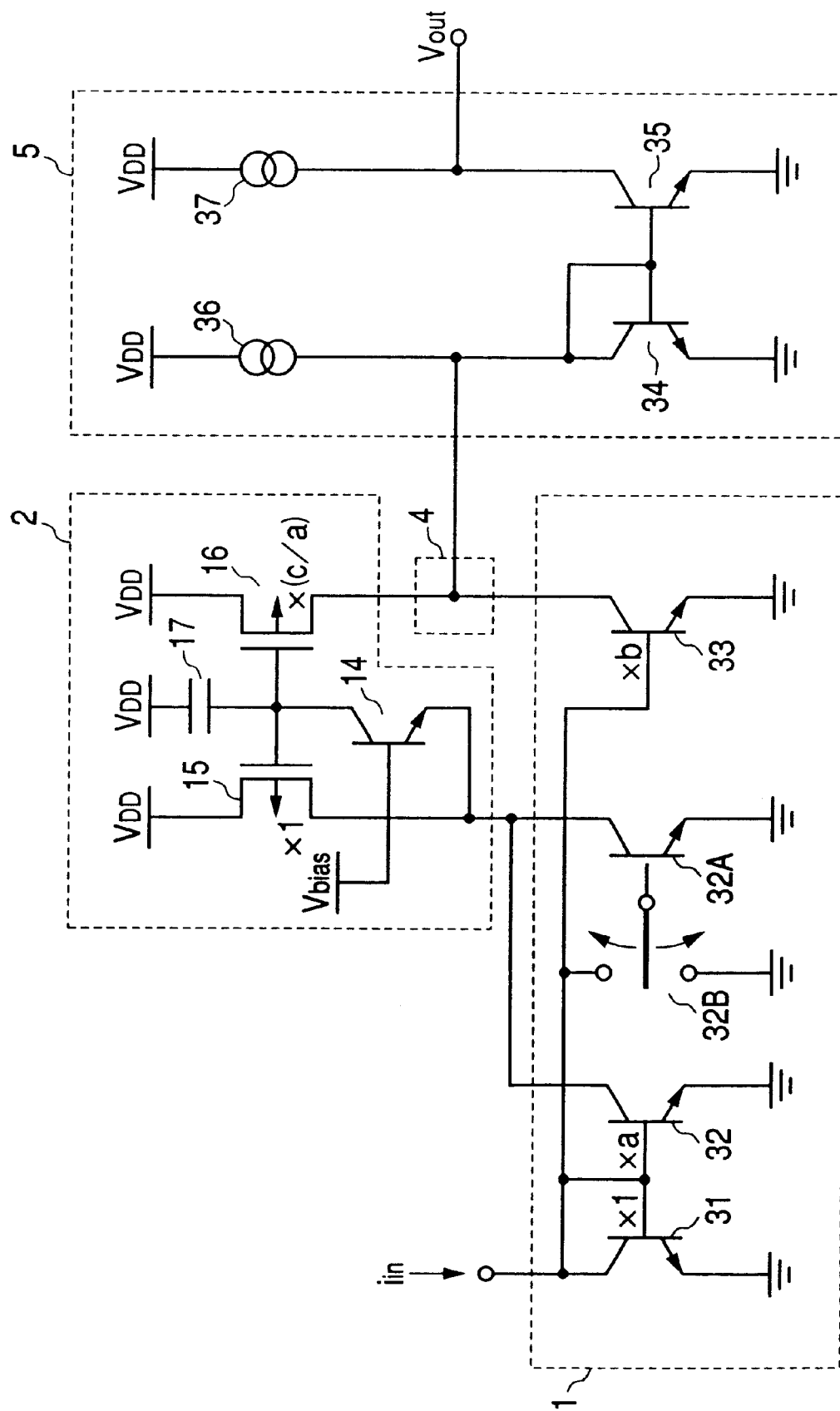
FIG. 20 is a diagram of the circuit in which the proportionality constant during determination of the threshold value can be selected.

Moreover, even when the elements are added parallel to the NPN transistor 32, the same effect can be obtained. FIG. 20 shows the circuit in which an NPN transistor 32A and switching element 32B are added. When the size of the NPN transistor 32A is the same as that of the NPN transistor 32, and when a base of the NPN transistor 32A indicates the ground potential by the switching element 32B, the NPN transistor 32A passes no current and the same effect as that of the circuit of FIG. 16 is indicated. On the other hand, when the base of the NPN transistor 32 and the base of the NPN transistor 32A are connected in common by the switching element 32B, the current mode peak hold means 2 outputs a current of $2c \cdot i_{in(peak)}$ and the threshold value of the current-voltage conversion means 5 is (2c/b) of the peak value of the input current $i_{in}$, so that the proportionality constant in determining the threshold value can be selected.

Figure 21:
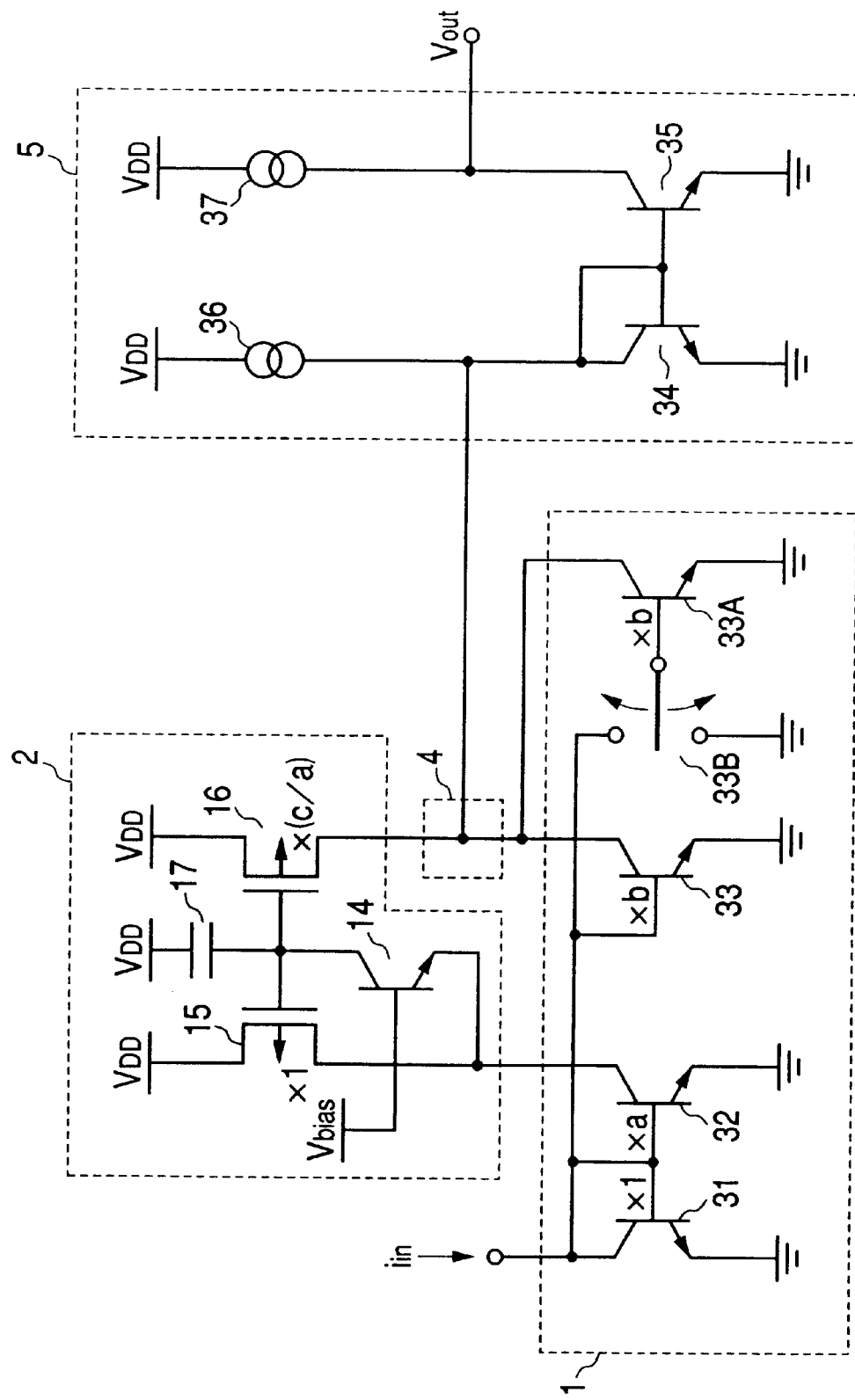
FIG. 21 is a diagram of the circuit in which the proportionality constant during determination of the threshold value can be selected.
Figure 22:
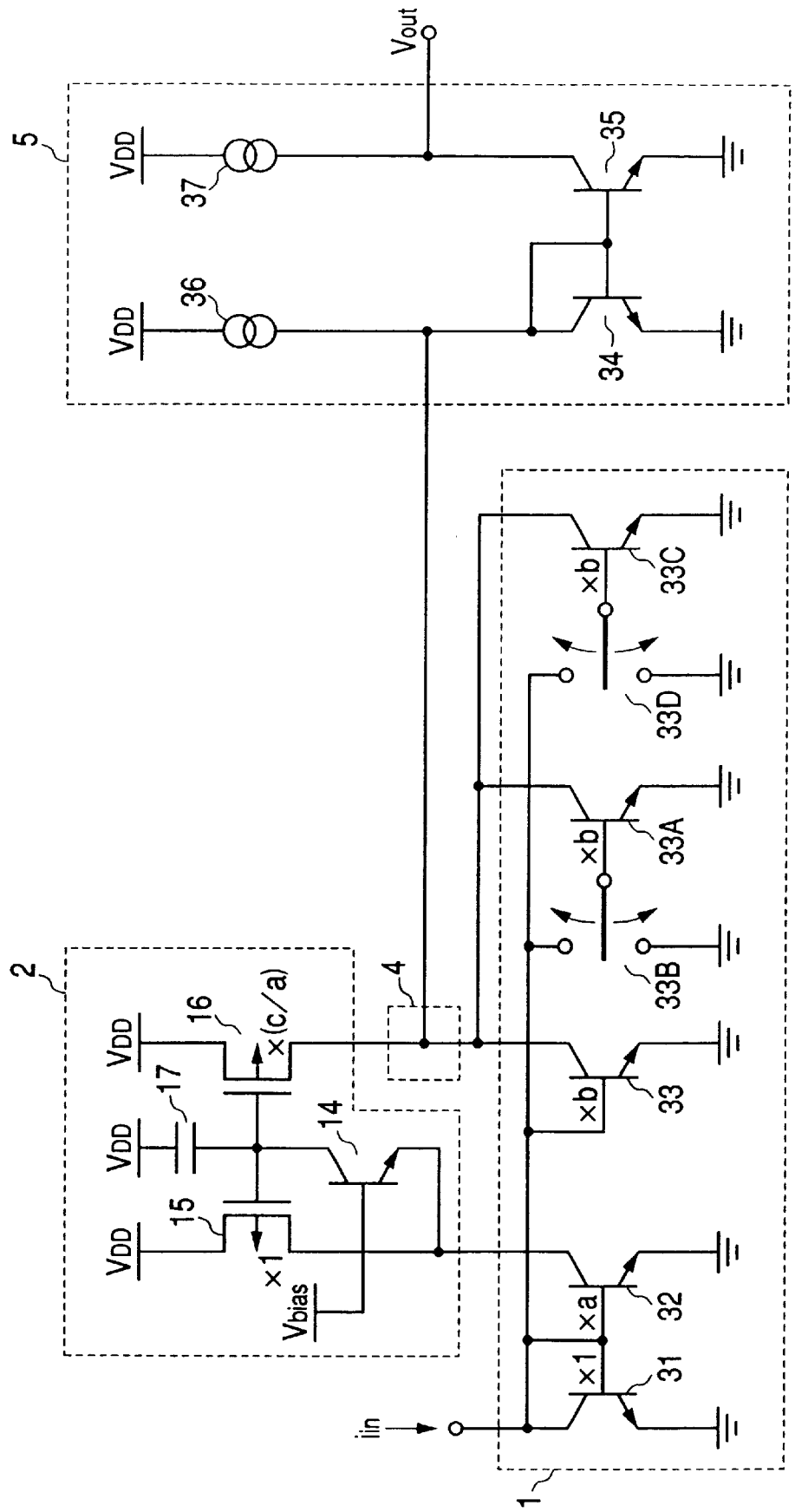
FIG. 22 is a diagram of the circuit in which the proportionality constant during determination of the threshold value can be selected.

FIG. 21 shows one example of the circuit in which the value of the proportionality constant c/b in determining the threshold value can be selected, and is a circuit constituted by adding an NPN transistor 33A with the same size as that of the NPN transistor 33, and switching element 33B to the circuit of FIG. 16. When the base of the NPN transistor 33A is the ground potential by the switching element 33B, the NPN transistor 33A passes no current and indicates the same effect as that of the circuit of FIG. 16. On the other hand, when the base of the NPN transistor 33 and the base of the NPN transistor 33A are connected in common by the switching element 33B, the current transmission means 1 outputs a current $2b \cdot i_{in}$ and the threshold value of the current-voltage conversion means 5 is (c/2b) of the peak value of the input current $i_{in}$, so that the proportionality constant in determining the threshold value can be selected. Additionally, in the present embodiment the size of the NPN transistor 33A is the same as that of the NPN transistor 33, but the size may of course be different. Furthermore, in the present embodiment, only the NPN transistor 33A and switching element 33B are added to FIG. 16, but a plurality of elements can further be added in parallel. FIG. 22 shows the circuit constituted by adding an NPN transistor 33C and switching element 33D. In this case, the proportionality constant in determining the threshold value can be selected further in multiple stages.

The aforementioned current-voltage converter can be applied to an optical detector. An example of application to a laser beam printer will be described hereinafter with reference to a schematic view.

Figure 23:
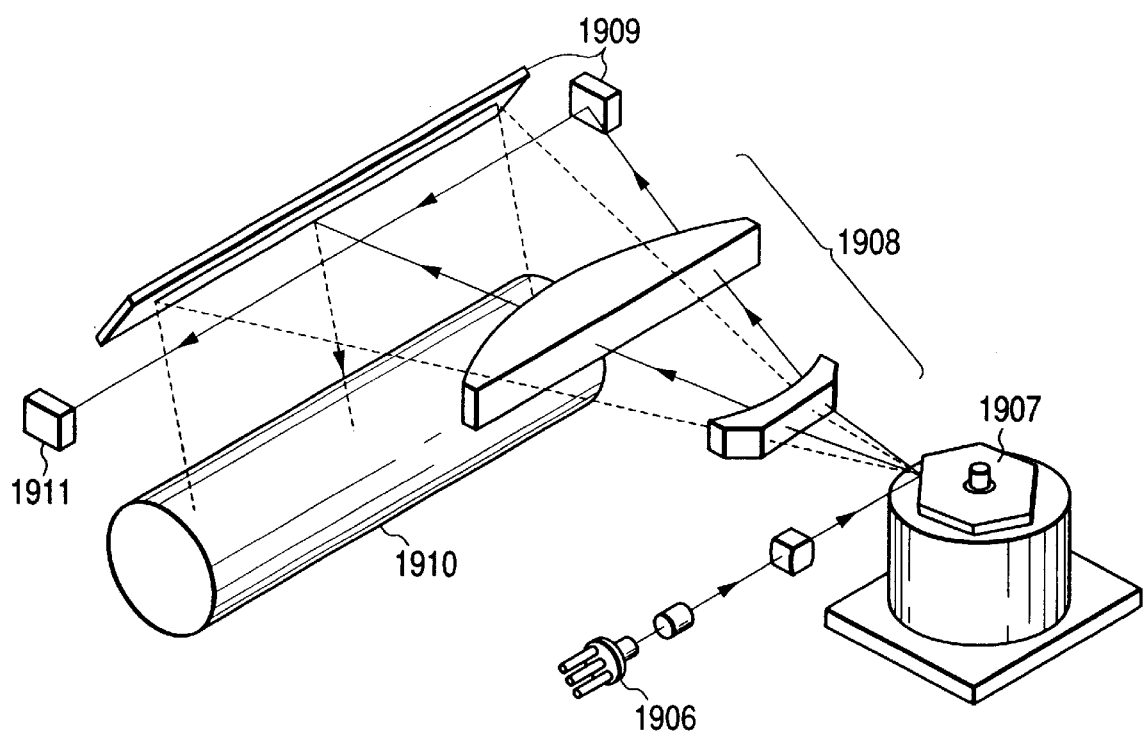
FIG. 23 is a schematic view of a laser beam printer to which the present invention is applied.

As shown in FIG. 23, a laser beam printer or another apparatus for using a laser light to form an image on a photosensitive drum surface is usually constituted of a laser diode 1906, a polygonal mirror 1907 for scanning the laser, a lens system 1908, a reflection mirror 1909, a photosensitive drum 1910, and the like, and an optical detection device 1911 detects that the laser light has passed a predetermined position, and generates a horizontal synchronizing signal as a binary electric signal.

Figure 24:
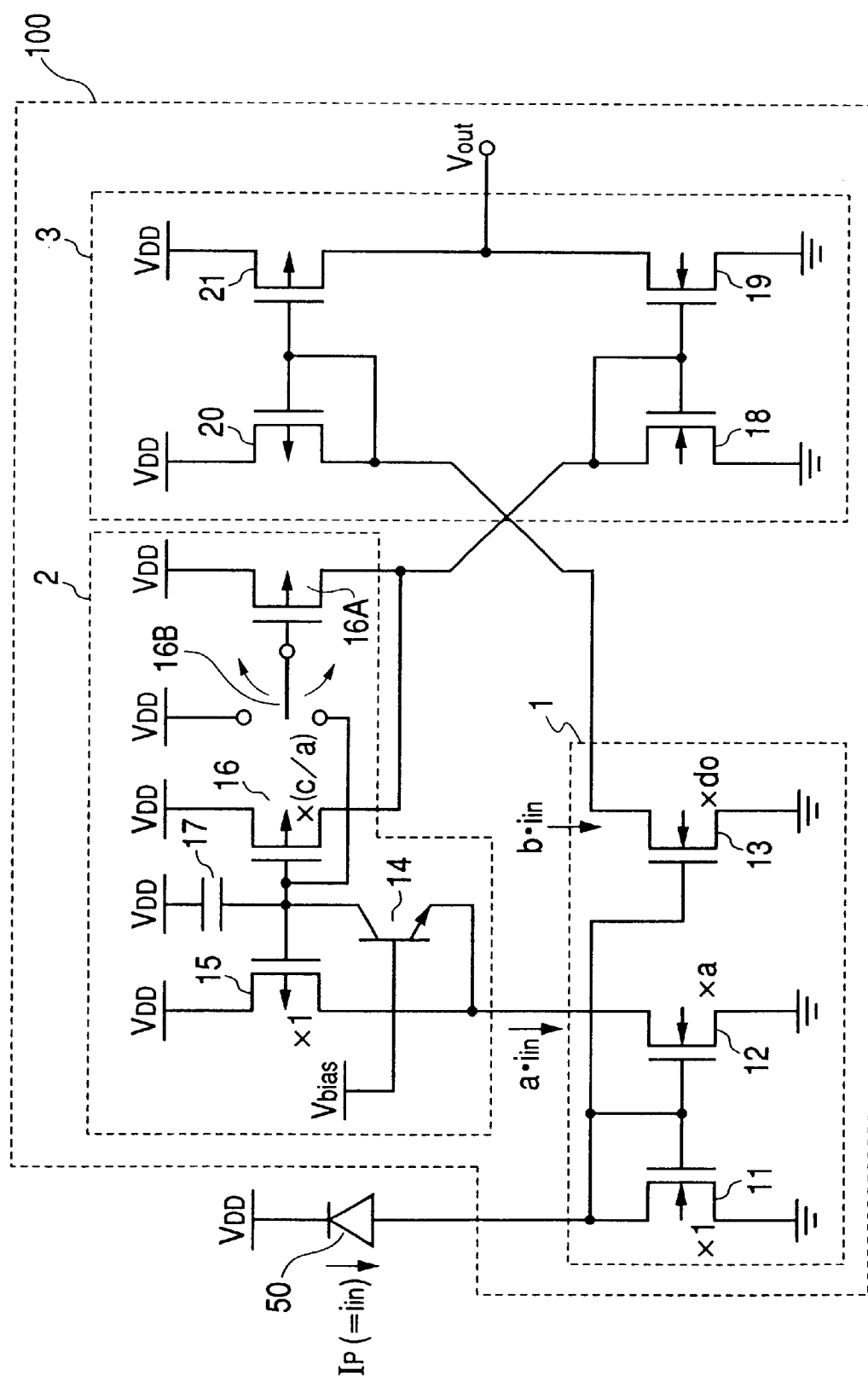
FIG. 24 is a diagram of the circuit in which the current-voltage converter is used.

FIG. 24 is a view of an optical detection device in which the current-voltage converter as one embodiment of the present invention is used, and the device can preferably be used as the optical detection device 1911 of an image forming apparatus shown in FIG. 23. In FIG. 24 numeral 50 denotes a photodiode as photoelectric conversion means, and a photocurrent $I_F$ is inputted to a current-voltage converter 100 whose operation has been described with reference to FIG. 7. According to the present embodiment, a threshold level of a constant ratio is automatically determined in accordance with a peak value of input light, a high-precision horizontal synchronous signal can constantly steadily be obtained regardless of fluctuation of an incident light quantity, and the ratio of the peak value of the input light to the threshold level can be changed. Therefore, in the optical detection device for the image forming apparatus for using laser light to form an image on the surface of a photosensitive drum, even when a laser light waveform differs among different types of apparatuses, the optimum threshold level can be set, and it is possible to provide the optical detection device and image forming apparatus with high general-purpose properties.

Additionally, it is of course possible to replace a circuit system of the current-voltage converter for use in the present embodiment with another circuit system.

As described above, according to the current-voltage converter of the present invention, the threshold value during the generation of the voltage pulse with a small circuit scale can change to indicate the constant ratio in accordance with the peak value of the input current. Furthermore, by selecting the ratio, there can be provided the current-voltage converter which is further easy to use.

What is claimed is:

1. A current-voltage converter for converting a current signal to a voltage pulse, comprising:
    current transmission means for outputting a plurality of currents proportional to an inputted current;
    current mode peak hold means for receiving, as input, one of the currents outputted from said current transmission means, and outputting a peak current proportional to a peak value of the received current; and
    current comparison means for comparing another one of the currents outputted from said current transmission means with the peak current outputted from said current mode peak hold means,
    whereas said current comparison means comprises a first current mirror circuit connected with said current transmission means and with an output terminal, and a second current mirror circuit connected with said current mode peak hold means and with said output terminal.

2. The current-voltage converter according to claim 1, wherein said current transmission means is constituted by a second current mirror circuit.

3. The current-voltage converter according to claim 2, wherein:
    in said second current mirror circuit, gates of first to third NMOS transistors are connected in common to directly connect the gate of said first NMOS transistor to a drain and input the inputted current, the drain of said second NMOS transistor is connected to said current mode peak hold means, and the drain of said third NMOS transistor is connected to said current comparison means,
    the gates of first and second PMOS transistors are connected in common to a capacitance whose one terminal is connected to a power source which supplies power to sources of said first and second PMOS transistors,
    said current mode peak hold means comprises an NPN transistor including an emitter connected to the drain of said first PMOS transistor, a base supplied with a constant potential and a collector connected to the gate of said first PMOS transistor, and connects the drain of said second PMOS transistor to said current comparison means,
    said current comparison means comprises third and fourth PMOS transistors and fourth and fifth NMOS transistors, and
    the gates of said third and fourth PMOS transistors are connected in common, said gate and the drain of said third PMOS transistor are connected to the drain of said third NMOS transistor, the gates of said fourth and fifth NMOS transistors are connected in common, said gate and the drain of said fourth NMOS transistor are connected to the drain of said second PMOS transistor, and the drain of said fourth PMOS transistor are connected to the drain of said fifth NMOS transistor to form said voltage output from the drain.

4. The current-voltage converter according to claim 2, further comprising means for selecting a proportionality constant in the current which is outputted by said current transmission means and which is proportional to the inputted current.

5. The current-voltage converter according to claim 1, further comprising means for selecting a proportionality constant in the current which is outputted by said current transmission means and which is proportional to the inputted current.

6. The current-voltage converter according to claim 1, further comprising means for selecting a proportionality constant in the current which is outputted by said current mode peak hold means and which is proportional to the peak value of the inputted current.

7. A current-voltage converter comprising:
    current transmission means for outputting a plurality of currents proportional to an inputted current;
    current mode peak hold means for receiving, as input, one of the currents outputted from said current transmission means, and outputting a peak current proportional to a peak value of the received current;
    subtraction means for obtaining a difference between another one of the currents outputted from said current transmission means and the peak current outputted from said current mode peak hold means;
    current-voltage conversion means for receiving, as input, a different current outputted from said subtraction means and outputting a voltage signal depending upon a direction of the difference current; and
    a selecting circuit for selecting a proportionality constant in determining a threshold value for current-voltage conversion.

8. The current-voltage converter according to claim 7, wherein said current transmission means is constituted by a current mirror circuit.

9. The current-voltage converter according to claim 7, wherein:
    said current transmission means comprises a current mirror circuit in which bases of first to third transistors are connected in common to directly connect the base of said first transistor to a collector and input the input current, the collector of said second transistor is connected to said current mode peak hold means, and the collector of said third transistor is connected to said subtraction means,
    the gates of first and second PMOS transistors are connected in common to a capacitance whose one terminal is connected to a power source which supplies power to sources of said first and second PMOS transistors, said current mode peak hold means comprises an NPN transistor including an emitter connected to the drain of said first PMOS transistor, a base supplied with a constant potential and a collector connected to the gate of said first PMOS transistor, and the drain of said second PMOS transistor is connected to said subtraction means, and said current-voltage conversion means comprises a current mirror circuit including fourth and fifth transistors, receives, as an input, an output of said subtraction means via the collector of one of said fourth and fifth transistors of said current mirror circuit, and emits the output from the collector of the other one of said fourth and fifth transistors of the current mirror circuit.

10. The current-voltage converter according to claim 9, further comprising means for selecting a proportionality constant in the current which is outputted by said current transmission means and which is proportional to the inputted current.

11. The current-voltage converter according to claim 7, further comprising means for selecting a proportionality constant in the current which is outputted by said current transmission means and which is proportional to the inputted current.

12. The current-voltage converter according to claim 7, further comprising means for selecting a proportionality constant in the current which is outputted by said current mode peak hold means and which is proportional to the peak value of the inputted current.

13. A printer comprising:

a photosensitive drum;

a laser diode for emitting a laser beam to form an image on said photosensitive drum; and an optical detection device for detecting said laser beam provided with a photodiode for supplying an inputted current, wherein said optical detection device comprises a current-voltage converter which comprises:

current transmission means for outputting a plurality of currents proportional to the inputted current;

current mode peak hold means for receiving, as input, one of the currents outputted from said current transmission means, and outputting a peak current proportional to a peak value of the received current; and current comparison means for comparing another one of the currents outputted from said current transmission means with the peak current outputted from said current mode peak hold means, whereas said current comparison means comprises a first current mirror circuit connected with said current transmission means and with an output terminal, and a second current mirror circuit connected with said current mode peak hold means and with said output terminal.

14. A printer, comprising:

a photosensitive drum;

a laser diode for emitting a laser beam to form an image on said photosensitive drum; and an optical detection device for detecting said laser beam provided with a photodiode for supplying an inputted current, wherein said optical detection device comprises a current-voltage converter which comprises:

current transmission means for outputting a plurality of currents proportional to the inputted current;

current mode peak hold means for receiving, as input, one of the currents outputted from said current transmission means, and outputting a peak current proportional to a peak value of the received current;

subtraction means for obtaining a difference between another one of the currents outputted from said current transmission means and the peak current outputted from said current mode peak hold means;

current-voltage conversion means for receiving, as input, a different current outputted from said subtraction means and outputting a voltage signal depending upon a direction of the difference current; and a selecting circuit for selecting a proportionality constant in determining a threshold value for current-voltage conversion.

15. A current-voltage converter comprising:

a current mirror circuit for outputting a plurality of currents proportional to an inputted current;

a current mode peak hold circuit for receiving, as input, one of the currents outputted from said current mirror circuit, and outputting a peak current proportional to a peak value of the received current;

a current comparison circuit for comparing another one of the currents outputted from said current mirror circuit with the peak current outputted from said current mode peak hold circuit, and outputting a voltage signal; and a selecting circuit for selecting a proportionality constant in determining a threshold value for current-voltage conversion.

16. A printer, comprising:

a photosensitive drum;

a laser diode for emitting a laser beam to form an image on said photosensitive drum; and an optical detection device for detecting said laser beam provided with a photodiode for supplying an inputted current, wherein said optical detection device comprises a current-voltage converter which comprises:

a current mirror circuit for outputting a plurality of currents proportional to the inputted current;

a current mode peak hold circuit for receiving, as input, one of the currents outputted from said current mirror circuit, and outputting a peak current proportional to a peak value of the received current;

a current comparison circuit for comparing another one of the currents outputted from said current mirror circuit with the peak current outputted from said current mode peak hold circuit, and outputting a voltage signal; and a selecting circuit for selecting a proportionality constant in determining a threshold value for current-voltage conversion.

* * * * *

UNITED STATES PATENT AND TRADEMARK OFFICE
CERTIFICATE OF CORRECTION

PATENT NO.    : 6,356,065 B1
DATED         : March 12, 2002
INVENTOR(S)   : Keizo Miyazaki It is certified that error appears in the above-identified patent and that said Letters Patent is hereby corrected as shown below:

Column 1,
Line 57, "a" should be deleted.

Column 7,
Line 55, "same" should read -- sake --.

Column 9,
Line 11, "has" should read -- have --.

Column 12,
Line 14, "are" should read -- is --.

Signed and Sealed this

Eighteenth Day of June, 2002

Attest:

JAMES E. ROGAN
Attesting Officer    Director of the United States Patent and Trademark Office